United States Patent
Nakajima et al.

(10) Patent No.: US 10,879,064 B2
(45) Date of Patent: Dec. 29, 2020

(54) METHOD FOR MANUFACTURING SEMICONDUCTOR DEVICE AND FILM FORMING APPARATUS

(71) Applicant: Sharp Kabushiki Kaisha, Sakai (JP)

(72) Inventors: Shinji Nakajima, Sakai (JP); Hirohiko Nishiki, Sakai (JP); Hirohide Mimura, Sakai (JP); Yuhichi Saitoh, Sakai (JP); Yujiro Takeda, Sakai (JP); Shogo Murashige, Sakai (JP); Izumi Ishida, Sakai (JP); Tohru Okabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/473,272

(22) PCT Filed: Dec. 15, 2017

(86) PCT No.: PCT/JP2017/045126
§ 371 (c)(1),
(2) Date: Jun. 25, 2019

(87) PCT Pub. No.: WO2018/123659
PCT Pub. Date: Jul. 5, 2018

(65) Prior Publication Data
US 2020/0194254 A1    Jun. 18, 2020

(30) Foreign Application Priority Data
Dec. 27, 2016    (JP) .................................. 2016-253392

(51) Int. Cl.
*H01L 29/66* (2006.01)
*H01L 29/786* (2006.01)
(Continued)

(52) U.S. Cl.
CPC .......... *H01L 21/0262* (2013.01); *C23C 16/18* (2013.01); *C23C 16/4583* (2013.01);
(Continued)

(58) Field of Classification Search
CPC .......... H01L 29/7869; H01L 29/66969; H01L 21/707; H01L 29/45; H01L 21/02631;
(Continued)

(56) References Cited

U.S. PATENT DOCUMENTS

| | | | |
|---|---|---|---|
| 6,686,210 B1* | 2/2004 | Gilbert | C23C 16/40 438/3 |
| 2010/0064966 A1* | 3/2010 | Horio | C30B 29/16 117/104 |

(Continued)

FOREIGN PATENT DOCUMENTS

| | | |
|---|---|---|
| JP | 2011-222984 A | 11/2011 |
| JP | 2012-134475 A | 7/2012 |

(Continued)

OTHER PUBLICATIONS

Official Communication issued in International Patent Application No. PCT/JP2017/045126, dated Feb. 27, 2018.

*Primary Examiner* — Brian Turner
(74) *Attorney, Agent, or Firm* — Keating & Bennett, LLP

(57) ABSTRACT

Provided is a method for manufacturing a semiconductor device, the semiconductor device including a substrate, and an oxide semiconductor TFT that is supported by the substrate and includes an oxide semiconductor film as an active layer. The method includes: (A) preparing MO gas containing a first organometallic compound that contains In and a second organometallic compound that contains Zn; and (B) supplying gas containing the MO gas and oxygen to the substrate placed in a chamber under a condition in which the substrate is heated to 500° C. or lower, and growing an oxide
(Continued)

semiconductor film containing In and Zn on the substrate using an MOCVD method. Step (B) is performed under a condition in which plasma is formed in the chamber.

10 Claims, 17 Drawing Sheets

(51) Int. Cl.
*H01L 21/02* (2006.01)
*H01L 21/441* (2006.01)
*C23C 16/18* (2006.01)
*C23C 16/458* (2006.01)
*C23C 16/46* (2006.01)
*C23C 16/50* (2006.01)
*H01J 37/32* (2006.01)
*H01L 29/24* (2006.01)

(52) U.S. Cl.
CPC .............. *C23C 16/46* (2013.01); *C23C 16/50* (2013.01); *H01J 37/32449* (2013.01); *H01J 37/32724* (2013.01); *H01L 21/02565* (2013.01); *H01L 29/24* (2013.01); *H01L 29/66969* (2013.01); *H01J 37/32816* (2013.01); *H01J 2237/3321* (2013.01); *H01L 21/02422* (2013.01); *H01L 29/7869* (2013.01)

(58) Field of Classification Search
CPC ........... H01L 21/02565; H01L 27/1262; H01L 21/32134; H01L 21/465; H01L 21/30604; H01L 27/1225

See application file for complete search history.

(56) References Cited

U.S. PATENT DOCUMENTS

| | | |
|---|---|---|
| 2011/0233541 A1 | 9/2011 | Yamazaki |
| 2012/0138922 A1 | 6/2012 | Yamazaki et al. |
| 2013/0009149 A1* | 1/2013 | Endo .................... H01L 27/1218 257/43 |
| 2013/0221356 A1* | 8/2013 | Yamazaki ........... H01L 27/1207 257/57 |
| 2013/0320334 A1 | 12/2013 | Yamazaki et al. |
| 2014/0042438 A1* | 2/2014 | Yamazaki ......... H01L 29/78693 257/43 |
| 2014/0231798 A1 | 8/2014 | Ono et al. |
| 2014/0286076 A1 | 9/2014 | Aoki et al. |
| 2015/0069383 A1 | 3/2015 | Suzuki et al. |
| 2015/0076491 A1 | 3/2015 | Yamazaki |
| 2015/0079729 A1* | 3/2015 | Yamazaki ........... H01L 21/0262 438/104 |
| 2015/0221507 A1* | 8/2015 | Won .................. C23C 16/45574 438/104 |

FOREIGN PATENT DOCUMENTS

| | | |
|---|---|---|
| JP | 2013-041945 A | 2/2013 |
| JP | 2014-007399 A | 1/2014 |
| JP | 2014-209727 A | 11/2014 |
| JP | 2015-073089 A | 4/2015 |
| JP | 2015-079947 A | 4/2015 |

\* cited by examiner

METHOD FOR MANUFACTURING SEMICONDUCTOR DEVICE AND FILM FORMING APPARATUS

TECHNICAL FIELD

The disclosure relates to a method for manufacturing a semiconductor device that is formed using an oxide semiconductor, and a film forming apparatus used in the manufacturing method.

BACKGROUND ART

An active matrix substrate used in a liquid crystal display device or the like is provided with a switching element, such as a thin film transistor (hereinafter referred to as "TFT"), for each pixel. As such a switching element, in related art, a TFT that includes an amorphous silicon film as an active layer (hereinafter referred to as "amorphous silicon TFT"), and a TFT that includes a polycrystalline silicon film as an active layer (hereinafter referred to as a "polycrystalline silicon TFT") are widely used.

In recent years, as a material for the active layer of the TFT, an oxide semiconductor is sometimes used in place of an amorphous silicon or a polycrystalline silicon. This type of TFT is referred to as "oxide semiconductor TFT." The oxide semiconductor has a higher mobility than the amorphous silicon. Thus, the oxide semiconductor TFT can operate at a higher speed than the amorphous silicon TFT.

In many cases, an oxide semiconductor layer is formed by a sputtering method (see PTL 1, for example). In PTL 1, it is proposed that a stacked semiconductor layer, in which two oxide semiconductor films with different compositions are stacked, is formed as the active layer of the semiconductor TFT, using the sputtering method.

In addition, in PTL 2, it is disclosed that an oxide semiconductor film is formed as the active layer of the oxide semiconductor TFT, in which a composition of the oxide semiconductor film continuously changes in the thickness direction. In PTL 2, as one of methods for forming such an oxide semiconductor film, a metal organic chemical vapor deposition (MOCVD) method is mentioned.

CITATION LIST

Patent Literature

PTL 1: JP 2013-41945 A
PTL 2: JP 2015-79947 A

SUMMARY

Technical Problem

In order to obtain a highly reliable oxide semiconductor TFT while ensuring a high TFT characteristics, it is important to control a composition, a thickness, and the like of an oxide semiconductor layer, for example. However, in a case where the oxide semiconductor layer is formed by the sputtering method, since the composition of the oxide semiconductor layer is determined by a target composition used in the sputtering method, the degree of freedom to select the composition is low. Further, since it is necessary to prepare the target corresponding to the composition of the oxide semiconductor to be formed, there is a risk that manufacturing costs become high.

On the other hand, in a case where the MOCVD method is applied, since the composition of the oxide semiconductor film can be easily changed by controlling a composition ratio of MO gas, the selection range of the composition of the oxide semiconductor layer is expanded.

However, after conducting a study, the present inventor has discovered that in a case where the MOCVD method is applied, it is difficult to form an oxide semiconductor film having stable desired film properties, and there is a problem in terms of practicality. Thus, it is difficult to obtain a highly reliable oxide semiconductor TFT. Details will be described below.

An embodiment of the disclosure has been conceived in light of the above-described circumstances, and an object of the disclosure is to provide a method for manufacturing a semiconductor device provided with a highly reliable oxide semiconductor TFT having stable properties. Further, an object of the disclosure is to provide a new film formation apparatus that can be applied to formation of oxide semiconductor films having a wide range of compositions and formation of an oxide semiconductor film having superior film properties.

Solution to Problem

A method for manufacturing a semiconductor device according to an embodiment of the disclosure is provided, in which the semiconductor device is provided with a substrate and an oxide semiconductor TFT being supported by the substrate and including an oxide semiconductor film as an active layer. The method for manufacturing a semiconductor device includes (A) preparing MO gas containing a first organometallic compound that contains In and a second organometallic compound that contains Zn, and (B) supplying gas containing the MO gas and oxygen to the substrate placed in a chamber under a condition in which the substrate is heated to 500° C. or lower, and growing the oxide semiconductor film containing In and Zn on the substrate using an MOCVD method. Step (B) is performed under a condition in which plasma is formed in the chamber.

In an embodiment, in step (B), a pressure of the chamber is set to be $3.3 \times 10^2$ Pa or higher and lower than $2.7 \times 10^3$ Pa.

In an embodiment, in step (B), the plasma is formed by a high frequency electric field, and a power density applied when generating the plasma is 1440 W/m$^2$ or greater and 4800 W/m$^2$ or less.

In an embodiment, at least one of the first organometallic compound and the second organometallic compound contains a methyl group.

In an embodiment, the substrate includes a glass substrate, and in a case where compositions in a depth direction of the oxide semiconductor film and the substrate are analyzed by a secondary ion mass spectrometry, a carbon component content contained in the oxide semiconductor film is 1/10 or less of the carbon component content contained in the glass substrate.

In an embodiment, the oxide semiconductor film does not substantially contain any carbon component.

In an embodiment, the oxide semiconductor film is an In—Ga—Zn—O based semiconductor film and has a layered structure including a lower film, an intermediate transition film, and an upper film from a side of the substrate in this order. The MO gas further contains a third organometallic compound that contains Ga. Step (B) includes: (B1) forming the lower film on the substrate under a condition in which, of a flow rate of the MO gas supplied to the substrate, a proportion of the first organometallic compound is set to F1a, a proportion of the second organometallic compound is set to F2a, and a proportion of the third organometallic compound is set to F3a; (B2) forming the intermediate transition film on the lower film while continuously changing the proportion of the third organometallic compound from F3a to F3b with respect to the flow rate of the MO gas supplied to the substrate; and (B3) forming the upper film on the intermediate transition film under a condition in which, of the flow rate of the MO gas supplied to the substrate, the proportion of the first organometallic compound is set to F1b, the ratio of the second organometallic compound is set to F2b, and the proportion of the third organometallic compound is set to F3b.

In an embodiment, in step (B2), the intermediate transition film is formed while continuously changing the proportion of the first organometallic compound from F1a to F1b as well as changing the proportion of the third organometallic compound with respect to the flow rate of the MO gas supplied to the substrate, and the proportions of the first organometallic compound and the third organometallic compound satisfy either F3a<F3b and F1a>F1b, or F3a>F3b and F1a<F1b.

A film formation apparatus according to an embodiment of the disclosure is configured to form an oxide semiconductor film on a substrate using an MOCVD method. The film formation apparatus includes: a gas generation unit configured to generate MO gas containing a plurality of organometallic compounds; a chamber; a support body being conductive and configured to support the substrate in the chamber; a heating device configured to heat the substrate; a gas distribution shower head disposed above the substrate in the chamber, the gas distribution shower head being conductive and provided with a plurality of first gas passages and a plurality of second gas passages formed at intervals and extending in the interior of the gas distribution shower head; a first gas supply unit configured to supply the MO gas into the chamber via the plurality of first gas passages; a second gas supply unit configured to supply gas containing oxygen into the chamber via the plurality of second gas passages; a power supply unit configured to supply power between the support body and the gas distribution shower head, the power supply unit including a high frequency power source connected to at least one of the support body and the gas distribution shower head; and a controller configured to control the power supply unit and the first and second gas supply units such that the MO gas and the gas containing the oxygen are supplied into the chamber under a condition in which the power is supplied between the support body and the gas distribution shower head to generate plasma.

Advantageous Effects of Disclosure

According to an embodiment of the disclosure, a semiconductor device provided with a highly reliable oxide semiconductor TFT having stable properties can be manufactured. Further, a film formation apparatus can be applied that can be adopted in the formation of oxide semiconductor films having a wide range of compositions and that can produce an oxide semiconductor film having high film properties.

BRIEF DESCRIPTION OF DRAWINGS

FIG. 3A is a diagram illustrating detected amounts that indicate relative ratios of $CH_3$, $C_2H_5$, $C_3H_7$, $C_4H_9$, and $C_6H_5$ desorbed from each of the In—Ga—Zn—O based semiconductor films of Example 1 and Comparative Examples 1 and 2 as a result of the rise in temperature, and FIG. 3B is a diagram illustrating detected amounts that indicate a relative ratio of $CH_3$ desorbed from the In—Ga—Zn—O based semiconductor films of each of the Examples and the Comparative Examples as a result of the rise in temperature.

DESCRIPTION OF EMBODIMENTS

Figure 1A:
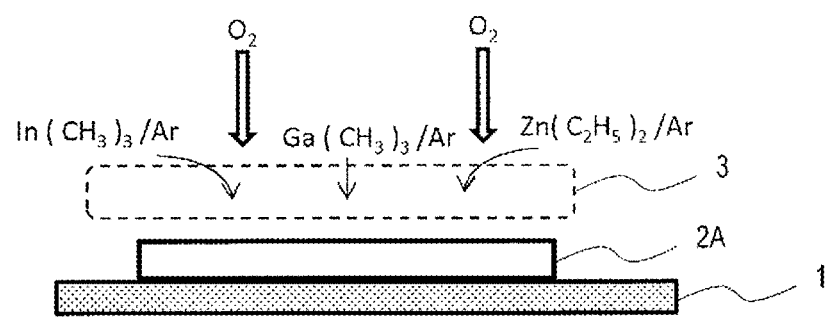
FIG. 1A is a schematic cross-sectional view for describing a method for forming In—Ga—Zn—O based semiconductor films of examples.

Of CVD processes that form a film on a substrate by causing a thin film material to react at a high temperature, an MOCVD method is a method that uses an organic metal as its material. For example, organometallic materials are used, such as trimethylindium as a raw material of indium (In), and trimethylgallium as a raw material of gallium (Ga). Although the organometallic material is liquid or solid at a normal temperature, by causing a carrier gas to flow into the organometallic material under a certain pressure, the organometallic material is vaporized and converted into metal organic gas (hereinafter referred to as "MO gas"). Decomposition and chemical reaction of the MO gas is caused to occur on a substrate that is heated to 1000° C. or higher, for example, and the MO gas grows (is deposited) on the substrate. In this manner, film formation is performed. The MOCVD method is used when forming a nitride semiconductor film, such as GaN, on a Si wafer, for example.

After conducting a study, the present inventor has discovered that when the above-described MOCVD method of the related art is applied to a manufacturing process of an oxide semiconductor TFT, desired TFT properties may not be obtained in a stable manner. Reasons for these findings are surmised as described below.

For example, on an active matrix substrate, the oxide semiconductor TFT is normally formed on a glass substrate. When attempting to form an oxide semiconductor film on a glass substrate using the MOCVD method, a substrate temperature needs to be sufficiently lower than a melting point of the glass, and needs to be set to be 500° C. or lower, for example, and preferably 400° C. or lower. However, in this temperature range, the MO gas does not sufficiently decompose, and a methyl group of the MO gas becomes likely to remain in the film. When a concentration of the residual methyl group in the oxide semiconductor film becomes high, stable film properties cannot be obtained, and as a result, there is a possibility that a high TFT characteristics cannot be realized in a stable manner.

On the basis of the above-described knowledge, the present inventor has studied in detail a formation method that can reduce the concentration of the residual methyl group of the oxide semiconductor film. As a result, it has been discovered and conceived in the disclosure that, by using plasma for a film formation step of the MOCVD method, a degree of dissociation of the MO gas is increased, and an oxide semiconductor film having a lower concentration of the residual methyl group can be formed.

In the MOCVD method of the related art, since the dissociation of the MO gas is performed using only thermal energy, a pressure inside a reaction chamber (a film formation pressure) needs to be set to a high pressure, and reactivity needs to be increased by setting a film formation temperature to a high temperature and thereby increasing the degree of dissociation of the MO gas. In contrast, in an MOCVD method that uses plasma (hereinafter referred to as "plasma MOCVD method" or "plasma-assisted MOCVD method"), not only the thermal energy, but also plasma energy is used for the dissociation of the MO gas. Thus, even when the substrate temperature is set to be equal to or lower than the melting point of the glass, the reactivity can be increased by increasing the degree of dissociation of the MO gas, and the oxide semiconductor film having lower concentration of the residual methyl group can be formed. In addition, even when the film formation pressure is set to be lower than that of the MOCVD method of the related art, high reactivity can be realized. Thus, a favorable oxide semiconductor film can be formed. Therefore, by using the oxide semiconductor film formed using the plasma MOCVD method, the oxide semiconductor TFT having stable properties can be manufactured.

Further, by adjusting a flow ratio of material gas, a composition of an oxide semiconductor layer can be controlled more easily with a higher degree of freedom. Thus, the performance and reliability of the oxide semiconductor TFT can be further improved.

First Embodiment

A first embodiment of a method for manufacturing a semiconductor device will be described below. It is sufficient that the semiconductor device manufactured in the present embodiment is provided with the oxide semiconductor TFT, and the semiconductor device widely includes circuit substrates, such as the active matrix substrate, various display devices, electronic devices, and the like.

The method for manufacturing a semiconductor device according to the present embodiment includes a formation method of an oxide semiconductor film that contains at least In and Zn. The oxide semiconductor film is used as an active layer of the oxide semiconductor TFT.

First, MO gas is prepared that contains at least a first organometallic compound containing In and a second organometallic compound containing Zn. The first organometallic compound may be trimethylindium ($In(CH_3)_3$, hereinafter referred to as "TMIn"), for example, and the second organometallic compound may be diethylzinc ($Zn(C_2H_5)_2$, hereinafter referred to as "DEZ"), for example. When an In—Ga—Zn—O based semiconductor film is formed as the oxide semiconductor film, the MO gas may further include trimethylgallium ($Ga(CH_3)_3$, hereinafter referred to as "TMGa") as a third organometallic compound. Similarly to the MOCVD method of the related art, the MO gas can be generated by bubbling the organometallic compounds of a liquid state with carrier gas.

Next, a substrate to be processed that includes a support substrate, such as a glass substrate, is placed in a chamber (a reaction chamber). The substrate to be processed is a substrate that includes a surface on which the oxide semiconductor film is to be formed. In a case where the oxide semiconductor TFT having a bottom gate structure is manufactured, a glass substrate on which a gate electrode and a gate insulating film are formed is used as the substrate to be processed. In a case where the oxide semiconductor TFT having a top gate structure is manufactured, a glass substrate on which a foundation film is formed is used as the substrate to be processed, for example. Hereinafter, the substrate to be processed will be simply referred to as the "substrate."

Next, under a condition in which the substrate is heated to the melting point or less (500° C. or lower, for example) of the support substrate (the glass substrate, for example), gas containing the MO gas and oxygen is supplied to the surface of the substrate (MOCVD method). Alternatively, RF power is applied under a condition in which the MO gas and the oxygen are contained in the chamber, or the MO gas and the oxygen are supplied under a condition in which plasma is formed in the chamber (plasma MOCVD method). In this way, the MO gas is caused to decompose and react as a result of the heat and plasma inside the chamber, and as a result, the oxide semiconductor film containing In and Zn is caused to grow on the substrate using the MOCVD method. In this manner, the oxide semiconductor film is formed.

Thereafter, by performing patterning on the oxide semiconductor film using a known method, the oxide semiconductor layer that forms the active layer of the oxide semiconductor TFT is obtained.

In the plasma MOCVD method, when the pressure inside the chamber (the film formation pressure) is too high, there may be a case in which a plasma state is not easily maintained. Thus, the film formation pressure is typically set to be lower than the film formation pressure (100 Torr or more, for example) of the MOCVD method of the related art. In the plasma MOCVD method, although the film formation pressure is low, a high film formation speed can be secured.

In the plasma MOCVD method, the pressure inside the chamber at the film formation step is set to be 2.5 Torr or greater and less than 20 Torr, namely, $3.3 \times 10^2$ Pa or higher and lower than $2.7 \times 10^3$ Pa. In a case where an exhaust capacity with respect to a total flow rate of the material gas (MO gas, carrier gas, and oxygen) is small, there may be a case in which the film formation pressure is not easily maintained to be less than 2.5 Torr. In addition, when the film formation pressure is 20 Torr or greater, there is a possibility that an electric discharge is not stable.

Plasma is formed by a high frequency electric field, for example. The RF power that generates the plasma can be set such that a power density thereof is 14 $W/m^2$ or greater. Specifically, the RF power is set to be 100 W (approximately 480 $W/m^2$) or greater, for example. In a case where the RF power is too low, the MO gas is insufficiently dissociated, and this may negatively influence the film quality. The RF power is preferably 300 W (approximately 1440 $W/m^2$) or greater and 1800 W (approximately 8650 $W/m^2$) or less, and is more preferably 300 W (approximately 1440 $W/m^2$) or greater and 1000 W (approximately 4800 $W/m^2$) or less.

In the present embodiment, at the film formation step of the MOCVD method, the MO gas is caused to decompose using not only the heat, but also the plasma. Thus, even though the substrate temperature is set to a relatively low temperature (500° C. or lower), metals such as In and Zn and organic groups such as the methyl group and an ethyl group can decompose at a high speed (with a high efficiency). Therefore, in the organometallic compounds, a proportion of the organometallic compounds that have not decomposed and been deposited on the substrate can be reduced. As a result, a concentration of the organic group that remains in the oxide semiconductor film can be reduced, and a higher quality oxide semiconductor film is thus obtained.

The plasma MOCVD method is particularly advantageous when at least one of the first organometallic compound and the second organometallic compound contains the methyl group. According to the MOCVD method of the related art, the methyl group having weak bonding is likely to remain in the oxide semiconductor film. In contrast, in the present embodiment, the concentration of the methyl group in the oxide semiconductor film can be significantly reduced. As described below, this can be verified by results obtained by analyzing the oxide semiconductor film using secondary ion mass spectrometry (SIMS), thermal desorption spectrometry (TDS), and the like.

EXAMPLES AND COMPARATIVE EXAMPLES

Oxide semiconductor films (In—Ga—Zn—O based semiconductor films, here) of examples and comparative examples were formed, and film properties of those oxide semiconductor films were evaluated. In Examples 1 to 3, the oxide semiconductor films were formed using the plasma MOCVD method. In Comparative Examples 1 and 2, the oxide semiconductor films were respectively formed using the MOCVD method of the related art and the sputtering method. Formation methods and analysis results of the oxide semiconductor films will be described below with reference to the drawings.

Formation Methods of Oxide Semiconductor Films of Examples 1 to 3 and Comparative Examples 1 and 2

Example 1

FIG. 1A is a schematic cross-sectional view for describing a method for forming the In—Ga—Zn—O based semiconductor films of the examples in which the plasma MOCVD method is used.

As illustrated in FIG. 1A, a glass substrate, as a substrate 1, was placed on a support table (not illustrated) in a chamber, and the substrate 1 was heated to 350° C. Further, in order to form plasma in the chamber, a high frequency (RF) voltage was applied between a lower electrode and an upper electrode (not illustrated), respectively located below and above the substrate 1. Here, a distance between the lower electrode and the upper electrode (an interelectrode distance) was set to 1000 mil (25.4 mm), and RF power of an industrial frequency (13.56 MHz) was applied between the electrodes. The RF power was set to 1000 W.

In this state, material gas containing the MO gas and the carrier gas (Ar gas, here) and gas containing oxygen (oxygen gas, here) were supplied into the chamber from above the substrate 1 in a normal direction of the substrate 1 at a predetermined flow rate. The MO gas contained trimethylindium (TMIn), trimethylgallium (TMGa), and diethylzinc (DEZ). The pressure inside the chamber was set to 2.5 Torr.

The material gas was generated using the same method as that of the MOCVD method of the related art. Here, TMIn, TMGa, and DEZ of a liquid state were respectively fed into material tanks and vaporized by bubbling with the carrier gas (Ar gas). The vaporized organometallic compounds were mixed into the carrier gas and transported into the chamber. A flow rate of the Ar gas used for bubbling each of the organometallic compounds, liquid temperatures inside the material tanks, a back pressure, and the like were adjusted such that a flow ratio of TMIn, TMGa, and DEZ in the material gas became 1:1:1. Specifically, the flow rates of TMIn, TMGa, and DEZ in the material gas were respectively set to approximately 0.68 sccm, and the total flow rate of the Ar gas in the material gas was set to 12 slm. The material gas was diffused into the chamber from a plurality of material gas supply ports provided at intervals of 8 mm in an upper part of the chamber. Further, the flow rate of the $O_2$ gas was set to 12 slm, and, similarly to the material gas, the $O_2$ gas was diffused into the chamber from a plurality of oxygen gas supply ports provided at intervals of 8 mm in the upper part of the chamber.

Between the upper electrode and the lower electrode in the chamber, the MO gas is converted into a plasma state 3 through a high frequency electric field, and as a result of In, Zn, and Ga dissociated from the MO gas chemically reacting with the oxygen, an In—Ga—Zn—O based semiconductor was deposited on the substrate 1. In this manner, an In—Ga—Zn—O based semiconductor film 2A having a thickness of approximately 100 mm was formed.

Example 2

Except that the RF power used for forming the plasma in the chamber was set to 300 W, the In—Ga—Zn—O based semiconductor film was formed in the same manner as in Example 1.

Example 3

Except that the RF power used for forming the plasma in the chamber was set to 100 W, the In—Ga—Zn—O based semiconductor film was formed in the same manner as in Example 1.

Comparative Example 1

Figure 1B:
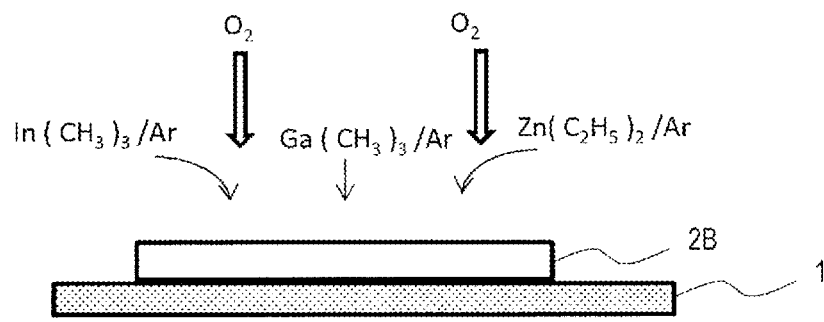
FIG. 1B is a schematic cross-sectional view for describing a method for forming the In—Ga—Zn—O based semiconductor film of a comparative example.

FIG. 1B is a schematic cross-sectional view for describing a method for forming the In—Ga—Zn—O based semiconductor film of Comparative Example 1 in which the MOCVD method of the related art without using the plasma is used.

In Comparative Example 1, as illustrated in FIG. 1B, a glass substrate, as the substrate 1, was placed in the chamber, and the substrate 1 was heated to 350° C. Next, in the same manner as in Example 1, the material gas and the oxygen gas were supplied into the chamber. The pressure inside the chamber was set to 20 Torr. Here, without applying the RF power between the upper electrode and the lower electrode in the chamber (under a condition in which the plasma was not formed), an In—Ga—Zn—O based semiconductor film was deposited on the substrate 1 using the MOCVD method. In this manner, an In—Ga—Zn—O based semiconductor film 2B was formed.

Comparative Example 2

As Comparative Example 2, an In—Ga—Zn—O based semiconductor film was formed on the glass substrate using a target that has a composition of In:Ga:Zn=1:1:1 according to a known sputtering method.

Measurement of Film Properties
X-Ray Photoelectron Spectroscopy (XPS) Measurement An X-ray photoelectron spectroscopy (XPS) measurement was performed on each of the In—Ga—Zn—O based semiconductor films of Examples 1 to 3 and Comparative Examples 1 and 2. The XPS measurement results and film formation conditions are shown in Table 1.

tor film containing more of the Zn component is obtained. However, in a case where the film formation is performed at a low RF power, since the Zn component enters the film due to being weakly bonded, the decomposition and the desorption easily occur when heated (see TDS analysis results). By optimizing the RF power, a film that contains the Zn component more strongly bonded can be formed (see the TDS analysis results).

Thermal Desorption Spectrometry (TDS) Analysis

Next, amounts of the organic groups, such as the methyl group, contained in the In—Ga—Zn—O based semiconductor films formed in Examples 1 to 3 and Comparative Examples 1 and 2 were examined by thermal desorption spectrometry (TDS). TDS is a method in which samples are heated in a high vacuum environment, and gas desorbed from the samples is analyzed at each temperature. According to TDS, desorption amounts and desorption temperatures of the gas discharged from the samples can be compared. In addition, since TDS is carried out in a vacuum atmosphere, hydrogen and water can also be analyzed with a high degree of sensitivity.

Here, each sample (a glass substrate including the In—Ga—Zn—O based semiconductor film on the surface thereof) of the Examples and the Comparative Examples was placed in a chamber of a TDS device and heated to 80 to 450° C. in the high vacuum environment. Analysis was performed on the gas desorbed as a result of the rise in temperature. $H_2$, $O_2$, $H_2O$, and the like that have typical compositions are quantified by calibration curves, and amounts of a $CH_3$ group and the like can be compared based on relative numerical values obtained from signal intensities.

Figure 2:
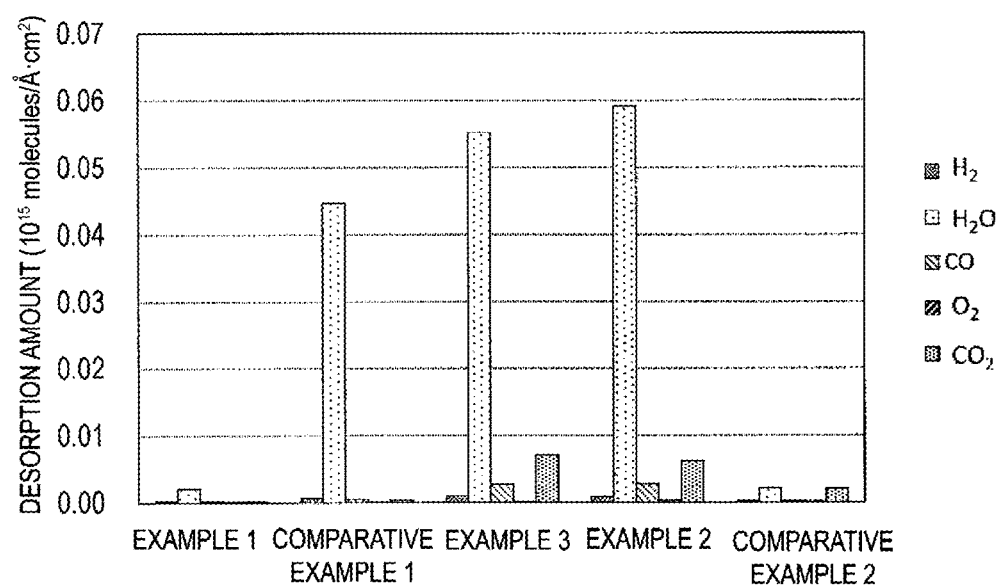
FIG. 2 is a diagram illustrating TDS analysis results of each of Examples and Comparative Examples, and is a diagram illustrating amounts of $H_2$, $H_2O$, $CO$, $O_2$, and $CO_2$ desorbed from an In—Ga—Zn—O based semiconductor film of each of the examples and the comparative examples as a result of a rise in temperature.
Figure 3A:
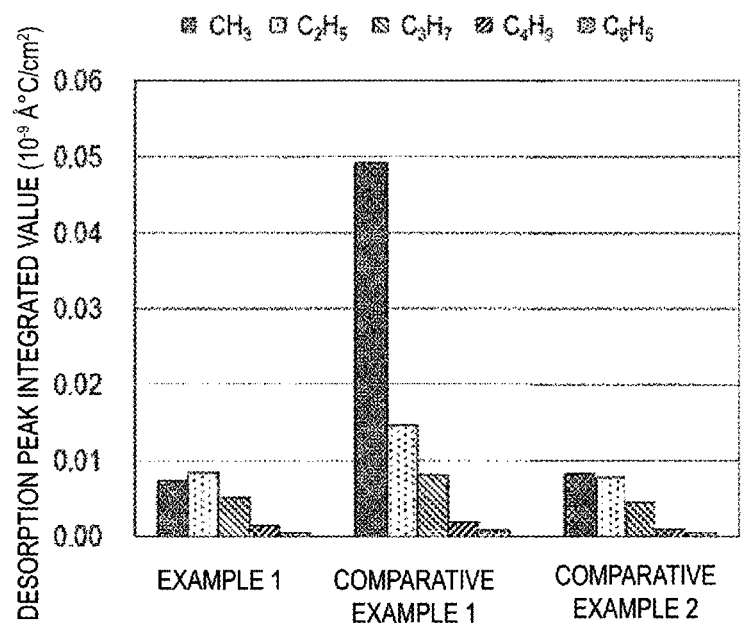
FIGS. 3A and 3B are diagrams illustrating TDS analysis results of the examples and the comparative examples, where
Figure 3B:
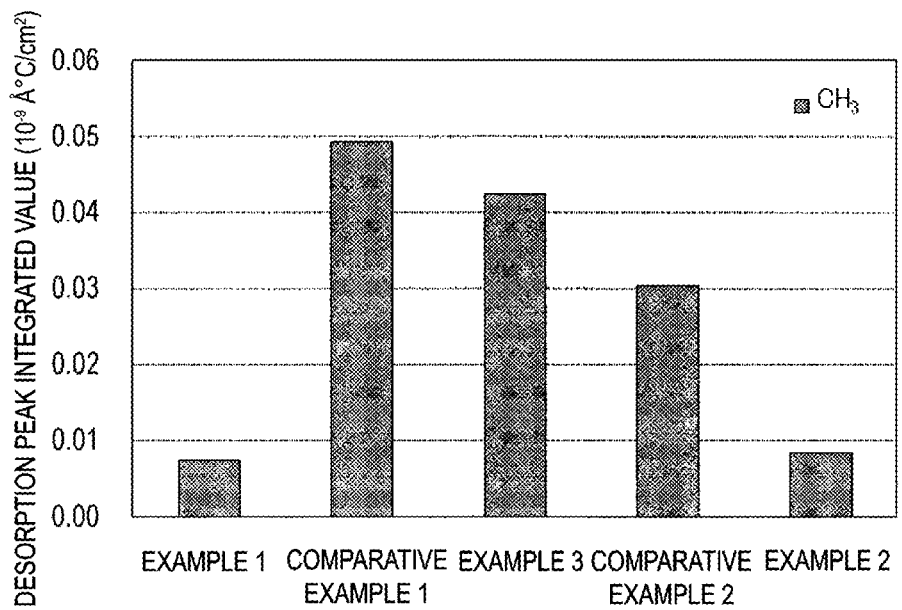
Figure 4:
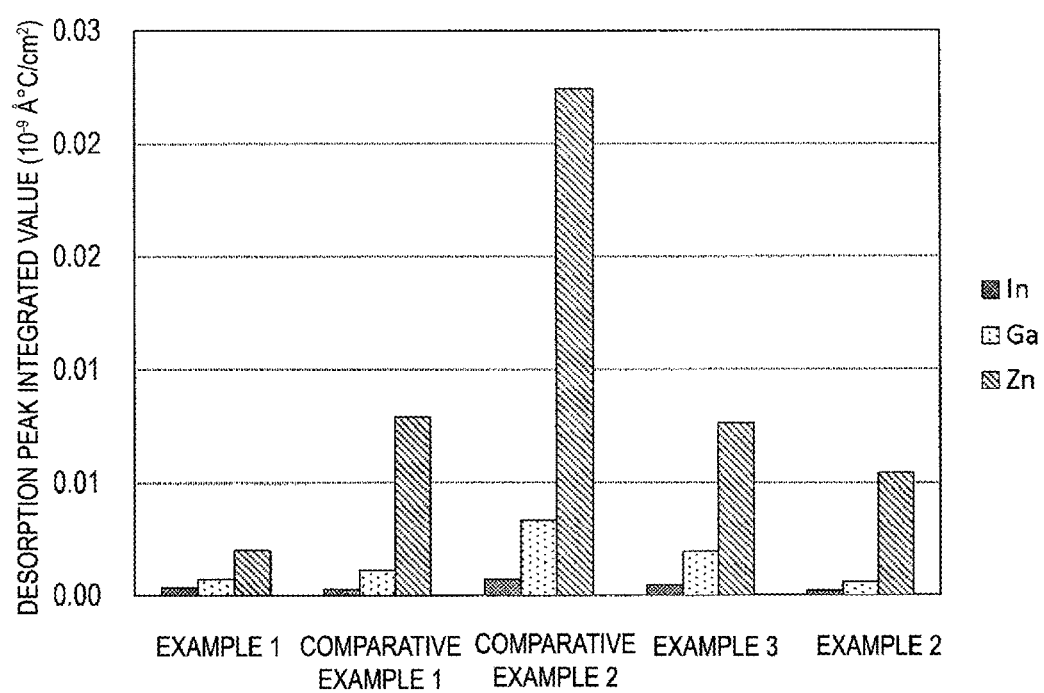
FIG. 4 is a diagram illustrating TDS analysis results of each of the examples and the comparative examples, and is a diagram illustrating detected amounts that indicate relative ratios of In, Ga, and Zn desorbed from the In—Ga—Zn—O based semiconductor film of each of the examples and the comparative examples as a result of the rise in temperature.

FIG. 2 to FIG. 4 are diagrams illustrating analysis results from TDS. FIG. 2 is a diagram illustrating the amounts (values quantified by the calibration curves) of $H_2$, $H_2O$, CO, $O_2$, and $CO_2$ desorbed from the In—Ga—Zn—O based semiconductor film of each of the examples and the comparative examples as a result of the rise in temperature. FIG. 3A is a diagram illustrating amounts (converted quantities) of $CH_3$, $C_2H_5$, $C_3H_7$, $C_4H_9$, and $C_6H_5$ desorbed from the In—Ga—Zn—O based semiconductor films of Example 1, Comparative Example 1, and Comparative Example 2 as a result of the rise in temperature. FIG. 3B is a diagram illustrating amounts (converted quantities) of $CH_3$ desorbed from the In—Ga—Zn—O based semiconductor film of each

TABLE 1

| | Substrate Temperature | RF Power | Pressure | MO Gas Flow Ratio | XPS Measurement Results (Atomic %: XPS Conversion Value) | | | |
|---|---|---|---|---|---|---|---|---|
| | (° C.) | W | Torr | TMIn:TMGa:DEZ | In | Ga | Zn | O |
| Example 1 | 350 | 1000 | 2.5 | 1:1:1 | 8.9 | 17.4 | 6.7 | 67 |
| Example 2 | 350 | 300 | 2.5 | 1:1:1 | 9.2 | 16.1 | 14.7 | 60 |
| Example 3 | 350 | 100 | 2.5 | 1:1:1 | 8.3 | 13 | 19.4 | 59.4 |
| Comparative Example 1 | 350 | 0 | 20 | 1:1:1 | 7.4 | 20.6 | 5.9 | 66.1 |
| Comparative Example 2 | Sputtering Method | | | | 13.5 | 13 | 15.8 | 57.7 |

From the analysis results of Examples 1 to 3, it is understood that even though the flow ratio of the material gas is the same, compositions of the In—Ga—Zn—O based semiconductor films are different when the RF power that forms the plasma changes. Specifically, in a case where the RF power is lower, the In—Ga—Zn—O based semiconducof the examples and the comparative examples as a result of the rise in temperature. FIG. 4 is a diagram illustrating amounts (converted quantities) of In, Ga, and Zn desorbed from the In—Ga—Zn—O based semiconductor film of each of the examples and the comparative examples as a result of the rise in temperature.

Note that although the In—Ga—Zn—O based semiconductor film formed using the sputtering method (Comparative Example 2) is substantially free of the organic groups, in the results illustrated in FIGS. 3A and 3B, tiny amounts of the organic groups, such as the methyl group, are detected. This is presumably due to measurement limitations. In other words, it is considered that the In—Ga—Zn—O based semiconductor film of Example 1, in which similar amounts of the organic groups to those of Comparative Example 2 were detected, was also substantially free of the organic groups.

From the results illustrated in FIGS. 3A and 3B, it is verified that by forming the In—Ga—Zn—O based semiconductor film using the plasma MOCVD method (Examples 1 to 3), the concentration of the residual methyl group in the In—Ga—Zn—O based semiconductor film is reduced in comparison with a case in which the In—Ga—Zn—O based semiconductor film is formed using the MOCVD method (Comparative Example 1). Thus, it is revealed that when the In—Ga—Zn—O based semiconductor films of Examples 1 to 3 are used, the TFT having more stable properties than in the case of using the MOCVD method of the related art (Comparative Example 1) can be manufactured.

Further, as illustrated in FIG. 2 and FIGS. 3A and 3B, moisture content in the In—Ga—Zn—O based semiconductor film was also reduced in Example 1 compared with that of Comparative Example 1 and the other examples. It is known that, in order to improve the film quality of the oxide semiconductor such as the In—Ga—Zn—O based semiconductor, a density of the oxide semiconductor film is increased by intentionally removing impurities, such as hydrogen, moisture, and hydroxyl groups, from the oxide semiconductor film through heating (see JP 2011-222984 A, for example). As can be understood from this, since the moisture content of the film that affects the properties can be reduced to a larger extent in Example 1 compared with Comparative Example 1, the TFT properties can be stabilized more effectively in Example 1. In particular, it is revealed that both the concentration of the residual methyl group and the like, and the moisture content in the In—Ga—Zn—O based semiconductor film of Example 1 are reduced to the same levels as those in a case of using the sputtering method (Comparative Example 2), and the In—Ga—Zn—O based semiconductor film of Example 1 has the same excellent film properties as those of the film formed using the sputtering method.

Thus, it was verified that the film quality can be further improved by increasing the RF power used for forming the plasma (400 W or greater, for example, and preferably 800 W or greater).

Further, from the results illustrated in FIG. 4, it is revealed that there are differences in the temperature at which the Zn component is dissociated from the In—Ga—Zn—O based semiconductor film of each of the examples and the comparative examples. In the In—Ga—Zn—O based semiconductor film formed using the MOCVD method (Comparative Example 1) and the In—Ga—Zn—O based semiconductor films of Examples 2 and 3, there is a tendency for the Zn component to dissociate when the temperature rises up to 450° C. In contrast, in the In—Ga—Zn—O based semiconductor film of Example 1, almost no dissociation of the Zn component was observed. On the basis of this, it is understood that the In—Ga—Zn—O based semiconductor film of Example 1 contains the Zn component, which is bonded as strongly as or more strongly than that of the In—Ga—Zn—O based semiconductor film formed using the sputtering method (Comparative Example 2). Although the RF power in Example 1 is 1000 W, it is considered that the same effects can be obtained as long as the RF power is 600 W (approximately 2900 W/m$^2$) or greater and 1200 W (approximately 5500 W/m$^2$) or less. Note that a range of the suitable RF power may change depending on the type, the flow ratio, the composition, and the like of the MO gas.

Figure 5A:
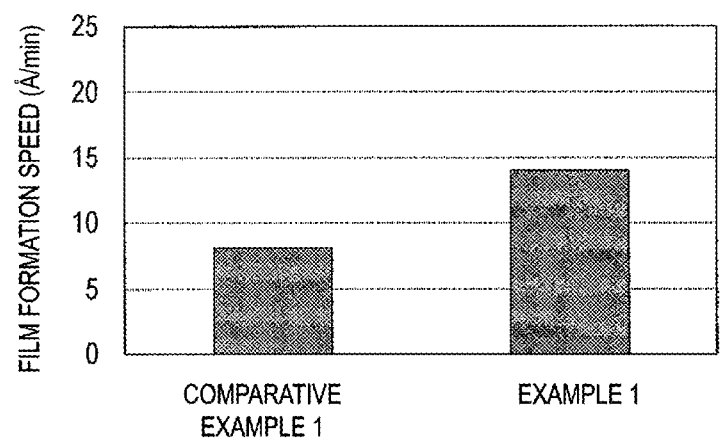
FIGS. 5A, 5B, and 5C are diagrams respectively illustrating measurement results of a film formation speed, composition ratios, and a refractive index of the In—Ga—Zn—O based semiconductor films of Example 1 and Comparative Example 1.
Figure 5B:
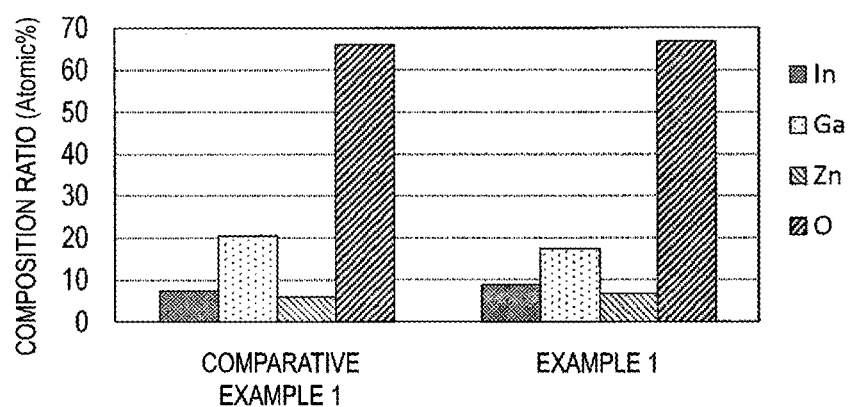
Figure 5C:
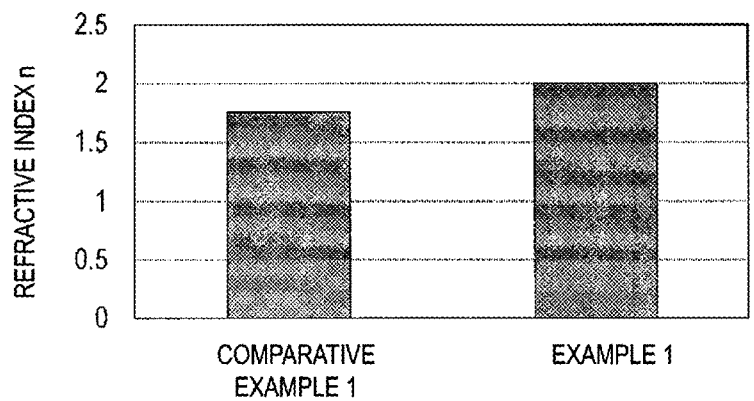

FIGS. 5A, 5B, and 5C are diagrams respectively illustrating measurement results of a film formation speed, a composition ratio, and a refractive index of the In—Ga—Zn—O based semiconductor films of Example 1 and Comparative Example 1. FIG. 5A illustrates the results obtained by forming the In—Ga—Zn—O based semiconductor films on wafers for the film formation speed measurement using the methods of Example 1 and Comparative Example 1, and measuring the film formation speed. The composition ratios illustrated in FIG. 5B are the XPS measurement results (see Table 1). FIG. 5C illustrates the results obtained by forming the In—Ga—Zn—O based semiconductor films on wafers for the refractive index measurement using the methods of Example 1 and Comparative Example 1, and measuring the refractive index.

As illustrated in FIG. 5A, it is understood that when the plasma MOCVD method is used, the film formation speed can be made faster than that of the MOCVD method of the related art. It is considered that this is because a dissociation speed of the MO gas is increased, and a film that can be more strongly bonded is formed as a result of using the plasma.

Further, from the results illustrated in FIGS. 5B and 5C, it is understood that although the composition ratios of the In—Ga—Zn—O based semiconductor films of Example 1 and Comparative Example 1 are substantially identical, the In—Ga—Zn—O based semiconductor film of Example 1 has a higher refractive index. This is due to the fact that the refractive index increased as a result of the formation of the film that can be more strongly bonded.

Analysis of Carbon Component in Oxide Semiconductor Film

In order to examine a residual amount of the methyl group in the oxide semiconductor film formed using the plasma MOCVD method, the carbon component content in the oxide semiconductor film was measured using secondary ion mass spectrometry (SIMS). A method for preparing samples, and analysis results will be described below.

Material gas containing TMIn, DEZ, and Ar gas (carrier gas) and oxygen gas were supplied onto a glass substrate, and an In—Zn—O based semiconductor film was formed using the plasma MOCVD method. In this manner, a sample A (a glass substrate that includes the In—Zn—O based semiconductor film on the surface thereof) of Example 4 was prepared. Further, for the purpose of comparison, the same type of gas as the sample A was supplied onto the glass substrate at the same flow ratio, and the In—Zn—O based semiconductor film was formed using the MOCVD method without using plasma. In this manner, a sample B of Comparative Example 3 was prepared.

Next, a composition analysis in the depth direction was performed on the sample A and the sample B using SIMS.

Figure 6A:
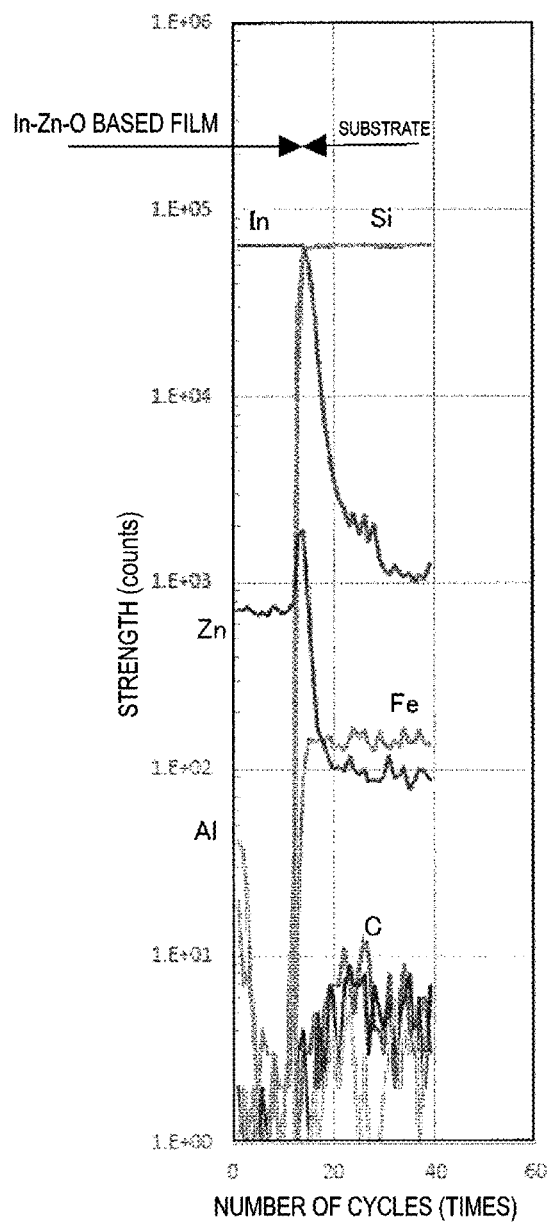
FIGS. 6A and 6B are diagrams respectively illustrating SIMS composition analysis results of samples of Example 4 and Comparative Example 3.
Figure 6B:
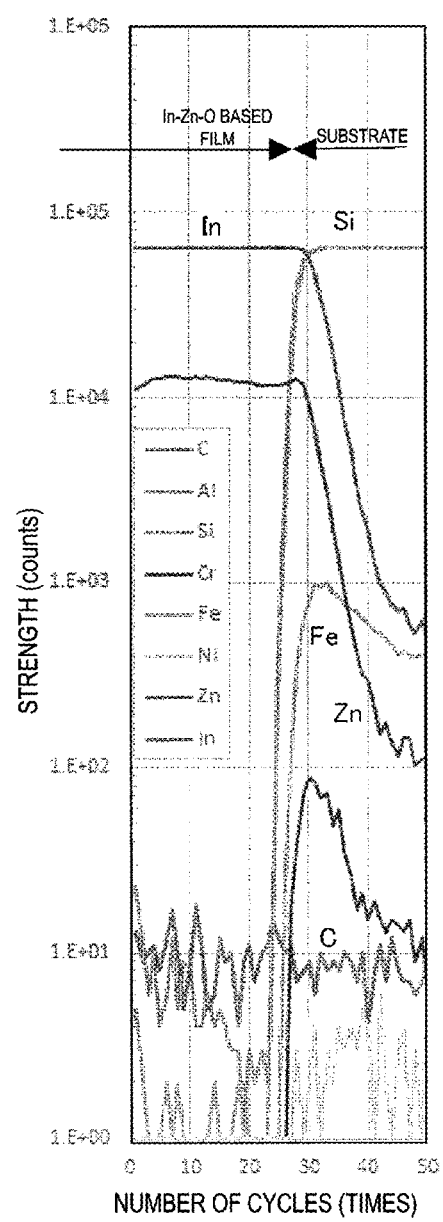
Figure 7A:
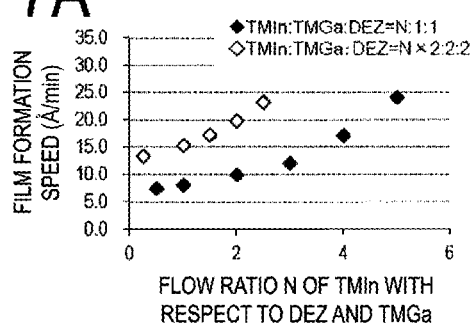
FIGS. 7A to 7F are diagrams respectively illustrating relationships of a flow ratio N of TMIn with respect to DEZ and TMGa with the film formation speed, the refractive index n, an In ratio, a Ga ratio, a Zn ratio, and an O ratio.
Figure 7B:
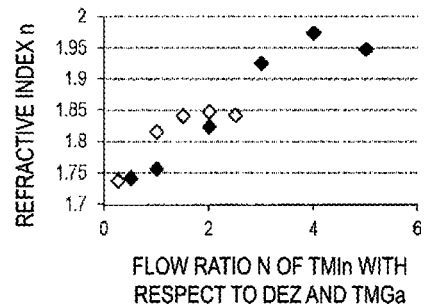
Figure 7C:
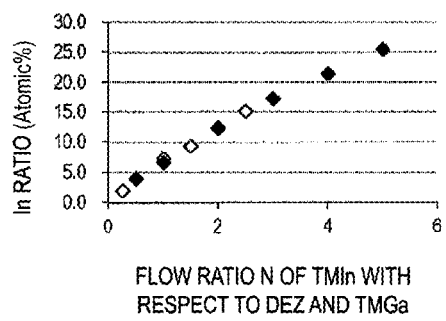
Figure 7D:
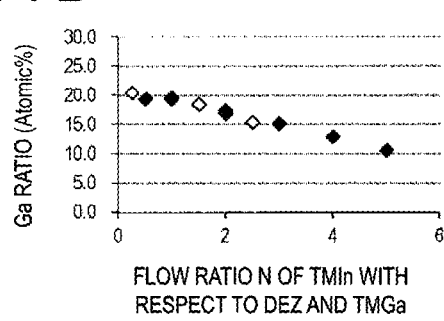
Figure 7E:
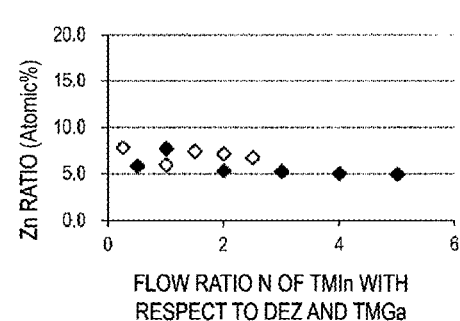
Figure 7F:
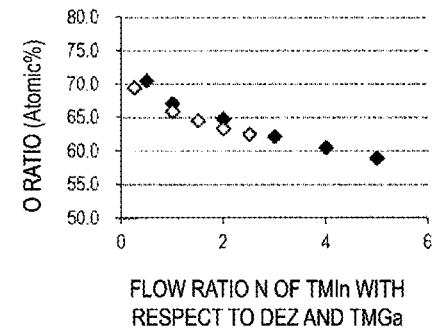
Figure 8A:
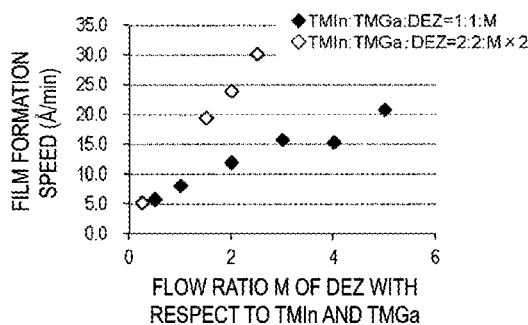
FIGS. 8A to 8F are diagrams respectively illustrating relationships of a flow ratio M of DEZ with respect to TMIn and TMGa with the film formation speed, the refractive index n, the In ratio, the Ga ratio, the Zn ratio, and the O ratio.
Figure 8B:
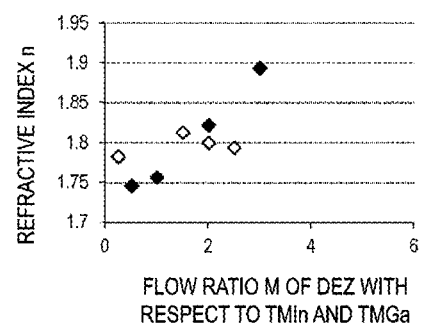
Figure 8C:
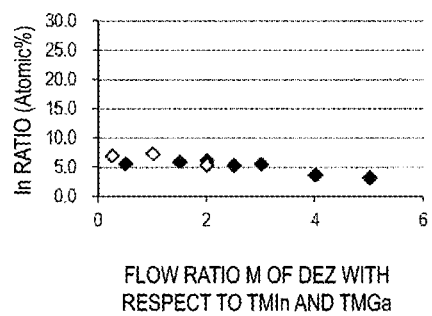
Figure 8D:
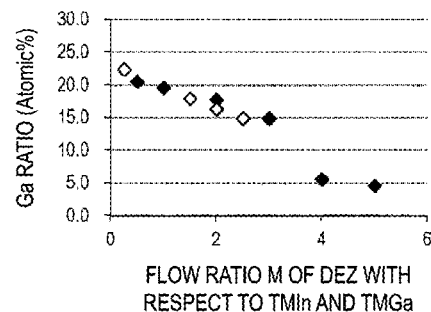
Figure 8E:
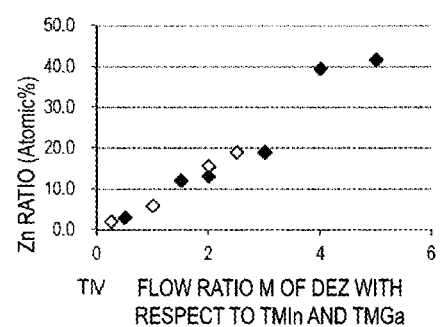
Figure 8F:
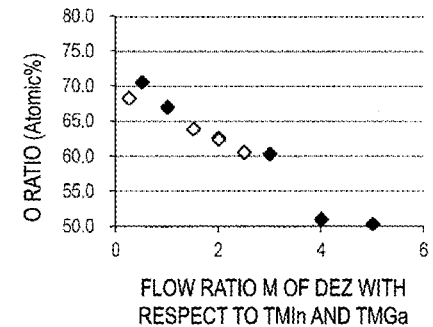

FIGS. 6A and 6B are diagrams respectively illustrating SIMS composition analysis results of the sample A and the sample B. The horizontal axis indicates number of measurement cycles, corresponding to the depth from the surface of the sample. The vertical axis indicates strength. In these analysis results, the glass substrate contains impurities such as $SiO_2$, Fe, and C. Thus, in the glass substrate, the carbon component is detected although the amount is small.

As illustrated in FIG. 6A, although high proportions of In and Zn are contained in the In—Zn—O based semiconductor film in the sample A, the carbon component is not detected. Thus, it is considered that the carbon component content is equal to or less than a detection limit (in other words, the carbon component is not substantially contained). A proportion of the carbon component in the In—Zn—O based semiconductor film is significantly smaller than a proportion of the carbon component contained in the glass substrate as impurities. The proportion is a half or less of the proportion of the carbon component contained in the glass substrate, and is 1/10 or less thereof in this example. On the other hand, as understood from FIG. 6B, the substantially same proportion of the carbon component as in the glass substrate is contained in the In—Zn—O based semiconductor film in the sample B. Thus, it is confirmed that when the oxide semiconductor film is formed using the plasma MOCVD method, the carbon component content can be significantly reduced compared with a case in which the MOCVD method is used.

Note that, here, although the description is made above using the In—Zn—O based semiconductor film as an example, even when the In—Ga—Zn—O based semiconductor film formed using the plasma MOCVD method is analyzed using SIMS, the same results as those described above are obtained.

Relationship Between Flow Ratio of Organometallic Compounds in Material Gas and Composition of Oxide Semiconductor Film As described above, in the present embodiment, the composition of the oxide semiconductor film can be controlled by adjusting the flow ratio of the material gas.

While using a case in which the In—Ga—Zn—O based semiconductor film is formed as an example, a relationship between the flow ratio of organometallic compounds and the composition of the oxide semiconductor film was examined. Results of the examination will be described below.

First, using conditions shown in Table 2, In—Ga—Zn—O based semiconductor films were formed on glass substrates as sample films 1 to 20. At the film formation step of each of the sample films, the flow rate of the carrier gas (Ar gas, here) applied when performing the bubbling of each of the liquid organometallic compounds was adjusted such that the flow ratio of TMIn:TMGa:DEZ in the material gas was a predetermined ratio. Further, when the flow ratio of TMIn:TMGa:DEZ was 1:1:1 (sample film 1), the flow rate of each of the organometallic compounds was set to 0.68 sccm. The flow ratios shown in Table 2 are values with respect to 0.68 sccm. For example, when the flow ratio of TMIn:TMGa:DEZ is 2:2:2 (sample film 12), the flow rate of each of the organometallic compounds is 1.36 sccm (0.68 sccm×2). Further, the substrate temperature at the time of film formation was set to a range of 350° C. or higher and 400° C. or lower. The flow rate of oxygen gas supplied into the chamber, the pressure inside the chamber, the interelectrode distance, and the RF power were kept constant. Further, under the same conditions as described above, the sample films 1 to 20 were also formed on Si wafers.

The XPS composition analysis was performed on the sample films 1 to 20 formed on the glass substrates. The analysis results are shown in Table 3. Further, spectroscopic ellipsometry was performed on the sample films 1 to 20 formed on the Si wafers, and a refractive index n, the thickness, and the film formation speed of each of the sample films were measured. The measurement results are shown in Table 3.

TABLE 2

| SAMPLE No. | TMIn:TMGa:DEZn | TMIn MO-Gas | TMGa Pushing | DEZn Ar(sccm) | O₂ (sccm) | Press (Torr) | GAP (mil) | Ts (° C.) |
|---|---|---|---|---|---|---|---|---|
| 1 | 1:1:1 | 380 | 5 | 50 | 12000 | 20 | 1000 | 350/400 |
| 2 | 2:1:1 | 760 | 5 | 50 | 12000 | 20 | 1000 | 350/400 |
| 3 | 3:1:1 | 1140 | 5 | 50 | 12000 | 20 | 1000 | 350/400 |
| 4 | 4:1:1 | 1520 | 5 | 50 | 12000 | 20 | 1000 | 350/400 |
| 5 | 5:1:1 | 1900 | 5 | 50 | 12000 | 20 | 1000 | 350/400 |
| 6 | ½:1:1 | 190 | 5 | 50 | 12000 | 20 | 1000 | 350/400 |
| 7 | 1:1:2 | 380 | 5 | 100 | 12000 | 20 | 1000 | 350/400 |
| 8 | 1:1:3 | 380 | 5 | 150 | 12000 | 20 | 1000 | 350/400 |
| 9 | 1:1:4 | 380 | 5 | 200 | 12000 | 20 | 1000 | 350/400 |
| 10 | 1:1:5 | 380 | 5 | 250 | 12000 | 20 | 1000 | 350/400 |
| 11 | 1:1:½ | 380 | 5 | 25 | 12000 | 20 | 1000 | 350/400 |
| 12 | 2:2:2 | 760 | 10 | 100 | 12000 | 20 | 1000 | 350/400 |
| 13 | 3:2:2 | 1140 | 10 | 100 | 12000 | 20 | 1000 | 350/400 |
| 14 | 4:2:2 | 1520 | 10 | 100 | 12000 | 20 | 1000 | 350/400 |
| 15 | 5:2:2 | 1900 | 10 | 100 | 12000 | 20 | 1000 | 350/400 |
| 16 | ½:2:2 | 190 | 10 | 100 | 12000 | 20 | 1000 | 350/400 |
| 17 | 2:2:3 | 760 | 10 | 150 | 12000 | 20 | 1000 | 350/400 |
| 18 | 2:2:4 | 760 | 10 | 200 | 12000 | 20 | 1000 | 350/400 |
| 19 | 2:2:5 | 760 | 10 | 250 | 12000 | 20 | 1000 | 350/400 |
| 20 | 2:2:½ | 760 | 10 | 25 | 12000 | 20 | 1000 | 350/400 |

TABLE 3

| | | on Si_Wafer by S. Eilipsometry | | | on glass CEN by XPS | | | |
|---|---|---|---|---|---|---|---|---|
| SAMPLE No. | TMIn:TMGa:DEZn | R.I n | Thickness (Å) | Depo. Rate (Å/min) | In | Ga | Zn | O |
| | | | | | (atomic %) | | | |
| 1 | 1:1:1 | 1.757 | 244 | 8.1 | 7.4 | 19.6 | 6.0 | 67.1 |
| 2 | 2:1:1 | 1.824 | 299 | 10.0 | 12.4 | 17.4 | 5.4 | 64.8 |

TABLE 3-continued

| SAMPLE No. | TMIn:TMGa:DEZn | on Si_Wafer by S. Ellipsometry | | | on glass CEN by XPS | | | |
|---|---|---|---|---|---|---|---|---|
| | | R.I n | Thickness (Å) | Depo. Rate (Å/min) | In | Ga | Zn | O |
| | | | | | (atomic %) | | | |
| 3 | 3:1:1 | 1.925 | 363 | 12.1 | 17.3 | 15.2 | 5.3 | 62.2 |
| 4 | 4:1:1 | 1.974 | 512 | 17.1 | 21.5 | 12.9 | 5.1 | 60.6 |
| 5 | 5:1:1 | 1.948 | 722 | 24.1 | 25.5 | 10.6 | 5.0 | 59.0 |
| 6 | ½:1:1 | 1.742 | 224 | 7.5 | 4.1 | 19.4 | 5.9 | 70.6 |
| 7 | 1:1:2 | 1.822 | 361 | 12.0 | 6.3 | 17.8 | 13.1 | 62.7 |
| 8 | 1:1:3 | 1.894 | 474 | 15.8 | 5.6 | 14.9 | 19.1 | 60.4 |
| 9 | 1:1:4 | 1.545 | 461 | 15.4 | 3.8 | 5.6 | 39.5 | 51.1 |
| 10 | 1:1:5 | 1.209 | 624 | 20.8 | 3.3 | 4.6 | 41.7 | 50.4 |
| 11 | 1:1:½ | 1.746 | 175 | 5.8 | 5.7 | 20.5 | 3.1 | 70.7 |
| 12 | 2:2:2 | 1.816 | 459 | 15.3 | 6.7 | 19.4 | 7.8 | 66.0 |
| 13 | 3:2:2 | 1.841 | 518 | 17.3 | 9.4 | 18.5 | 7.5 | 64.6 |
| 14 | 4:2:2 | 1.848 | 594 | 19.8 | 12.5 | 16.9 | 7.2 | 63.4 |
| 15 | 5:2:2 | 1.842 | 696 | 23.2 | 15.2 | 15.4 | 6.8 | 62.6 |
| 16 | ½:2:2 | 1.738 | 402 | 13.4 | 2.1 | 20.4 | 7.9 | 69.5 |
| 17 | 2:2:3 | 1.813 | 584 | 19.5 | 6.0 | 17.9 | 12.1 | 64.0 |
| 18 | 2:2:4 | 1.800 | 721 | 24.0 | 5.5 | 16.3 | 15.7 | 62.5 |
| 19 | 2:2:5 | 1.794 | 906 | 30.2 | 5.4 | 14.9 | 19.0 | 60.7 |
| 20 | 2:2:½ | 1.783 | 159 | 5.3 | 7.1 | 22.4 | 2.1 | 68.4 |

Based on the results, the relationship between the flow ratio in the material gas, and the composition and properties of the oxide semiconductor film was examined.

As one example, based on the measurement results of the sample films 1 to 6 and 12 to 16 in which flow rates of TMGa and DEZ were identical, the relationship between the flow ratio of TMIn and the film properties was examined. FIGS. 7A to 7F are diagrams respectively illustrating relationships of a flow ratio N of TMIn with respect to DEZ and TMGa with the film formation speed, the refractive index n, an In ratio, a Ga ratio, a Zn ratio, and an O ratio. In those diagrams, the measurement results of the sample films 1 to 6 (TMIn:TMGa:DEZ=N:1:1) are each shown by a black square ♦, and the measurement results of the sample films 12 to 16 (TMIn:TMGa:DEZ=2×N:2:2) are each shown by a white square ◇. Based on these results, it is confirmed that the In ratio of the oxide semiconductor film can be controlled by the flow ratio N of TMIn with respect to DEZ and TMGa. Further, it is also understood that when the flow ratio of TMIn with respect to DEZ and TMGa is increased, the film formation speed increases, and a film with a higher refractive index is obtained.

Similarly, based on the measurement results of the sample films 1, 7 to 11, and 17 to 20, in which flow rates of TMGa and TMIn were identical, the relationship between the flow ratio of DEZ and the film properties was examined. FIGS. 8A to 8F are diagrams respectively illustrating relationships of a flow ratio M of DEZ with respect to TMIn and TMGa with the film formation speed, the refractive index n, the In ratio, the Ga ratio, the Zn ratio, and the O ratio. In those diagrams, the measurement results of the sample films 1, and 7 to 11 (TMIn:TMGa:DEZ=1:1:M) are each shown by the black square ♦, and the measurement results of the sample films 17 to 20 (TMIn:TMGa:DEZ=2:2:2×M) are each shown by the white square ◇. Based on these results, it is confirmed that the Zn ratio of the oxide semiconductor film can be controlled by the flow ratio M of DEZ with respect to TMIn and TMGa. Further, it is also understood that when the flow ratio M of DEZ with respect to TMIn and TMGa is increased, the film formation speed increases, and a film with a higher refractive index is obtained.

As exemplified in FIGS. 7A to 7F and FIGS. 8A to 8F, the composition and properties of the oxide semiconductor film change depending on the flow ratio in the material gas. Thus, it is confirmed that the composition and properties of the oxide semiconductor film can be controlled by adjusting the flow ratio in the material gas.

Further, based on the results shown in Table 2 and Table 3, the flow ratio of the material gas can be calculated for the purpose of forming an oxide semiconductor film having a desired composition. For example, composition ratios of In, Ga, Zn, and O are respectively defined as $Z+a \times TMI+b \times TMG+c \times DeZ$ (Z and a to c: Coefficients, TMI: Flow ratio of TMIn, TMG: Flow ratio of TMGa, and DeZ: Flow ratio of DEZ), and a value of each of the coefficients is calculated by the least-squares method. Based on the obtained formula, the flow ratio for forming the In—Ga—Zn—O based semiconductor film of a desired composition is calculated. As one example, the flow ratio of TMIn:TMGa:DEZ for forming a typical In—Ga—Zn—O based semiconductor film of In:Ga:Zn=1:1:1 (In:Ga:Zn:O=12.4:13.8:13.6:60.2 atomic %) at the substrate temperature of 350° C. was calculated as 3.5:1.8:3.

Oxide Semiconductor

In the above-described Examples, the In—Ga—Zn—O based semiconductor film was formed as the oxide semiconductor film, but the oxide semiconductor included in the oxide semiconductor film and the oxide semiconductor layer of the TFT is not limited to the In—Ga—Zn—O based semiconductor.

The oxide semiconductor may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to a plane.

The oxide semiconductor film or the oxide semiconductor layer of the TFT (hereinafter simply referred to as the "oxide semiconductor film") formed by the plasma MOCVD method may have a layered structure of two or more layers. In a case where the oxide semiconductor film has the layered structure, the oxide semiconductor film may include an amorphous oxide semiconductor layer and a crystalline oxide semiconductor layer. Alternatively, the oxide semiconductor film may include a plurality of crystalline oxide semiconductor layers having different crystal structures. In addition, the oxide semiconductor film may include a plurality of amorphous oxide semiconductor layers. In a case where the oxide semiconductor film has a dual-layer structure including an upper layer and a lower layer, an energy gap of the oxide semiconductor included in the upper layer is preferably greater than the energy gap of the oxide semiconductor included in the lower layer. However, when a difference between the energy gaps of these layers is relatively small, the energy gap of the oxide semiconductor of the lower layer may be greater than the energy gap of the oxide semiconductor of the upper layer.

Materials, structures, and film formation methods of the amorphous oxide semiconductors and each of the above-described crystalline oxide semiconductors, and a configuration of the oxide semiconductor layer having the layered structure are described in JP 2014-007399 A, for example. For reference, the entire contents of JP 2014-007399 A are incorporated herein.

The oxide semiconductor film may include at least one metal element selected from In, Ga, and Zn, for example. In the present embodiment, the oxide semiconductor film includes an In—Ga—Zn—O based semiconductor (such as indium gallium zinc oxide), for example. Here, the In—Ga—Zn—O based semiconductor is a ternary oxide of In (indium), Ga (gallium), and Zn (zinc), and the ratios (composition ratios) of In, Ga, and Zn are not particularly limited to specific values. For example, the ratios include In:Ga:Zn=2:2:1, In:Ga:Zn=1:1:1, or In:Ga:Zn=1:1:2. Such an oxide semiconductor film can be formed from an oxide semiconductor film including an In—Ga—Zn—O based semiconductor.

The In—Ga—Zn—O based semiconductor may be an amorphous semiconductor or a crystalline semiconductor. A crystalline In—Ga—Zn—O based semiconductor in which the c-axis is oriented substantially perpendicular to the layer surface is preferable as the crystalline In—Ga—Zn—O based semiconductor.

Note that the crystal structure of the crystalline In—Ga—Zn—O based semiconductor is disclosed in the above-mentioned JP 2014-007399 A, JP 2012-134475 A, and JP 2014-209727 A, for example. For reference, the entire contents of JP 2012-134475 A and JP 2014-209727 A are incorporated herein. Since a TFT including an In—Ga—Zn—O based semiconductor layer has high mobility (more than 20 times in comparison with a-Si TFTs) and low leakage current (less than 1/100th in comparison with a-Si TFTs), such a TFT can be suitably used as a driving TFT (a TFT included in a driving circuit that is provided around a display region including a plurality of pixels and on the same substrate as the display region, for example) and as a pixel TFT (a TFT provided in a pixel).

The oxide semiconductor film may include another oxide semiconductor in place of the In—Ga—Zn—O based semiconductor. For example, the oxide semiconductor film may include an In—Sn—Zn—O based semiconductor ($In_2O_3$—$SnO_2$—ZnO; InSnZnO, for example). The In—Sn—Zn—O based semiconductor is a ternary oxide of In (indium), Sn (tin), and Zn (zinc). Alternatively, the oxide semiconductor film may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

Second Embodiment

A semiconductor device of a second embodiment will be described below. The semiconductor device of the present embodiment is provided with an oxide semiconductor TFT having a layered structure as the active layer.

As described above, it has been proposed that an oxide semiconductor layer having a structure (layered structure) in which oxide semiconductor films having mutually different compositions are stacked be used as the active layer of the oxide semiconductor TFT. For example, PTL 1 discloses that the oxide semiconductor layer having the layered structure is formed by the sputtering method for the purpose of forming a highly reliable oxide semiconductor TFT having high mobility.

However, after conducting a study, the present inventor has discovered that when the oxide semiconductor layer having the layered structure is formed by the sputtering method, stable TFT properties may not be obtained due to an interface state generated between two oxide semiconductor films having mutually different film qualities. This becomes a factor that causes the reliability of the oxide semiconductor TFT to deteriorate.

Figure 17:
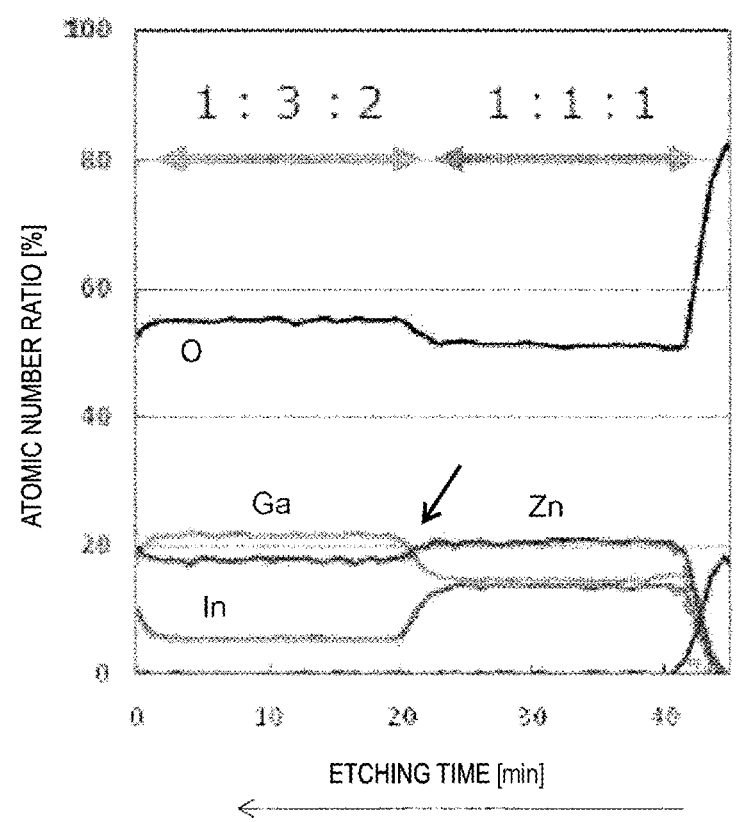
FIG. 17 is a diagram exemplifying an element distribution, in the depth direction, of an oxide semiconductor layer of a reference example formed by a sputtering method.

As a reference example, the present inventor formed an oxide semiconductor layer having a dual-layer structure using the sputtering method, and examined the element distribution thereof in the depth direction using Auger electron spectroscopy. The results are shown in FIG. 17. In this reference example, an In—Ga—Zn—O based semiconductor film of In:Ga:Zn=1:1:1 was used as the lower layer, and an In—Ga—Zn—O based semiconductor film of In:Ga:Zn=1:3:2 was used as the upper layer. As illustrated by arrows in FIG. 17, it is understood that an interface is clearly formed between the two layers having mutually different compositions.

The present inventor has discovered that the generation of the interface state can be suppressed by providing an intermediate transition layer that has a continuously changing composition between the two oxide semiconductor films having the mutually different compositions (the upper layer and the lower layer). The intermediate transition layer can be easily formed using the plasma MOCVD method, for example. The composition of the intermediate transition layer continuously changes in the depth direction so as to smoothly bridge a composition difference in metal elements (In and Ga, for example) between the upper layer and the lower layer. By using the oxide semiconductor layer having such a layered structure, it is possible to provide a highly reliable oxide semiconductor TFT in which an impact of the interface state on the TFT properties is mitigated.

The configuration of the semiconductor device of the present embodiment will be described in more detail with reference to the drawings.

Figure 9A:
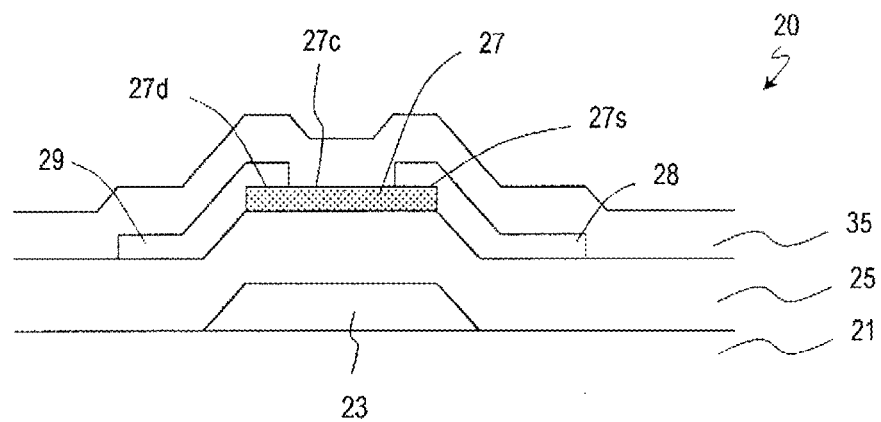
FIG. 9A is a cross-sectional view illustrating an example of an oxide semiconductor TFT 20 in a semiconductor device of a second embodiment.
Figure 9B:
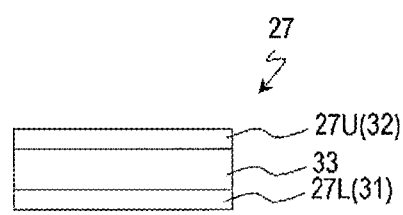
FIG. 9B is an enlarged cross-sectional view of an oxide semiconductor layer 27 that is an active layer of the TFT 20.

FIG. 9A is a cross-sectional view illustrating an example of an oxide semiconductor TFT 20 in the semiconductor device of the present embodiment, and FIG. 9B is an enlarged cross-sectional view of an oxide semiconductor layer 27 that is an active layer of the TFT 20.

The TFT 20 is provided with a support substrate 21, a gate electrode 23 supported on the support substrate 21, the oxide semiconductor layer 27, a gate insulating layer 25 disposed between the oxide semiconductor layer 27 and the gate electrode 23, and a source electrode 28 and a drain electrode 29 that are electrically connected to the oxide semiconductor layer 27. The TFT 20 is covered by an insulating layer (a passivation film) 35, for example.

The TFT 20 is a channel etched type TFT having a bottom gate structure, for example. The gate electrode 23 is disposed on a side of the support substrate 21 of the oxide semiconductor layer 27. The gate insulating layer 25 covers the gate electrode 23, and the oxide semiconductor layer 27 is disposed so as to be overlapped with the gate electrode 23 via the gate insulating layer 25. Further, the source electrode 28 and the drain electrode 29 are each disposed so as to be in contact with an upper face of the oxide semiconductor layer 27.

The oxide semiconductor layer 27 includes a channel region 27c, and a source contact region 27s and a drain contact region 27d that are positioned respectively on both sides of the channel region 27c. The source electrode 28 and the drain electrode 29 are respectively formed so as to be in contact with the source contact region 27s and the drain contact region 27d. In this specification, when viewed from a normal direction of the support substrate 21, in the oxide semiconductor layer 27, the "channel region 27c" is positioned between the source contact region 27s and the drain contact region 27d, and is a region that includes a portion in which a channel is formed. In the present embodiment, of the channel region 27c, the channel is formed near the gate insulating layer 25 of a first layer 31.

Figure 10:
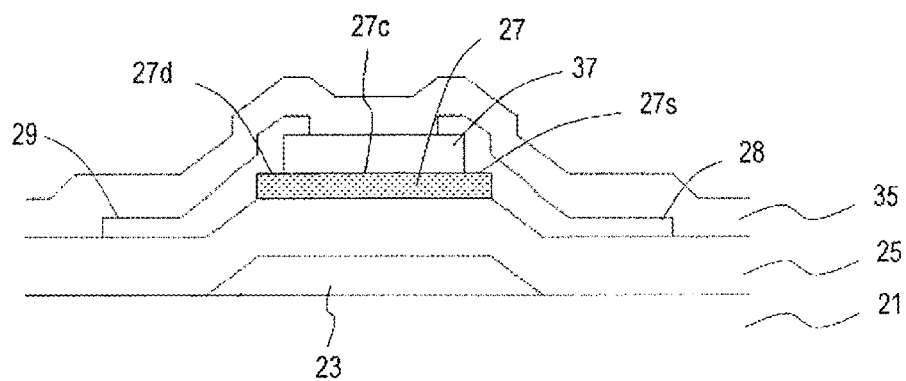
FIG. 10 is a cross-sectional view illustrating another oxide semiconductor TFT of the second embodiment.

The structure of the oxide semiconductor TFT in the present embodiment is not limited to the structure illustrated in the drawings. For example, as illustrated in FIG. 10, the oxide semiconductor TFT may be an etch stop type TFT having a bottom gate structure. In the etch stop type oxide semiconductor TFT, an etch stop layer 37 is disposed at least above a portion of the oxide semiconductor layer 27 that forms the channel region, so as to be in contact with the upper face of the oxide semiconductor layer 27. The source electrode 28 and the drain electrode 29 are each disposed on the etch stop layer 37 so as to be in contact with the upper face of the oxide semiconductor layer 27. Although not illustrated, the oxide semiconductor TFT may also have a top gate structure.

As illustrated in FIG. 9B, the oxide semiconductor layer 27 has a layered structure including a lower layer 27L, an intermediate transition layer 33, and an upper layer 27U, in this order from the side of the support substrate 21. In this specification, of the lower layer 27L and the upper layer 27U, the layer positioned on a side of the gate insulating layer 25 may be referred to as the "first layer 31", and the other layer as a "second layer 32." The first layer 31 (the lower layer 27L, here) can function as a channel layer in which the channel is formed. Mobility of the first layer 31 is higher than mobility of the second layer 32. The second layer 32 (the upper layer 27U, here) can function as a blocking layer that has higher etching resistance or higher barrier properties than the channel layer. The intermediate transition layer 33 is disposed between the first layer 31 and the second layer 32 so as to be in contact with both the first layer 31 and the second layer 32. The first layer 31 is the bottommost layer of the oxide semiconductor layer 27, and may be in contact with an upper face of the gate insulating layer 25. The second layer 32 is the uppermost layer of the oxide semiconductor layer 27, and may configure the upper face of the oxide semiconductor layer 27. An upper face of the second layer 32 may be in contact with the source electrode 28, the drain electrode 29, and the insulating layer 35 (or the etch stop layer 37). Note that in the TFT having the top gate structure, the upper layer is the first layer 31, and the lower layer is the second layer 32.

The oxide semiconductor layer 27 contains In, Zn, and Ga, for example. The oxide semiconductor layer 27 may be an In—Ga—Zn—O based semiconductor film.

The first layer 31 and the second layer 32 may have mutually different compositions. "Having mutually different compositions" means that each of the layers contains different types or different composition ratios of metal elements. The first layer 31 has a suitable composition as the channel layer. For example, the first layer 31 contains a lot of relatively low-resistance metal elements such as In and Zn, and is a high-mobility layer having high mobility. The second layer 32 has a composition that can have high barrier properties. For example, the second layer 32 is a highly reliable layer that contains a lot of Ga. By providing the second layer 32, during a manufacturing process of the TFT 20 or after the TFT 20 is manufactured, impurities such as hydrogen, which have entered from an opening or the like of an insulating film such as a passivation film, can be inhibited from entering into the first layer 31. As a result, oxygen deficiency can be inhibited from occurring in the first layer 31. Thus, it is possible to inhibit the impurities such as the hydrogen from causing resistance of the first layer 31 to be reduced, thereby allowing desired TFT properties to be secured. Further, in a case of the channel etched type TFT, at a source/drain separation step and the like, the second layer 32 can function as a protection layer and a sacrificing layer of the first layer 31, which is the channel layer.

The composition of the intermediate transition layer 33 continuously changes from the composition of the first layer 31 to the composition of the second layer 32. In other words, the intermediate transition layer 33 has a composition that changes so as to continuously bridge the composition difference between the first layer 31 and the second layer 32, in order to prevent the interface state from being generated due to the composition difference. Note that the oxide semiconductor layer 27 of the present embodiment may further include layers other than the above-described three layers.

As described above, when the oxide semiconductor layer of the related art having the layered structure is used, there has been a problem that a TFT having high reliability cannot be obtained due to the interface state generated in the interface between the upper layer and the lower layer. In contrast, in the present embodiment, since the interface state does not exist between the upper layer 27U and the lower layer 27L of the oxide semiconductor layer 27 that has the layered structure including the high-mobility layer, a deterioration of the reliability caused by the interface state can be suppressed. Thus, the TFT 20 having high mobility and good reliability can be realized. Further, according to the present embodiment, the composition difference between the first layer 31 and the second layer 32 can be increased while ensuring the reliability at the same time. Thus, the compositions of the first layer 31 and the second layer 32 can be set to be more suitable compositions corresponding to the respective functions. As a result, the properties and reliability of the TFT can be more effectively improved.

As described below, the oxide semiconductor layer 27 is formed by the plasma MOCVD method, for example. In a case where the plasma MOCVD method is used, as a result of performing the film formation step while changing the flow ratio in the material gas, the intermediate transition layer 33 can be easily formed that has a smoothly changing composition. Further, by adjusting the flow ratio in the material gas, the compositions of the first layer 31 and the second layer 32 can be selected with a high degree of freedom.

Composition and Thickness of Each Layer of Oxide Semiconductor Layer 27

A preferable composition of each of the layers 31 to 33 will be described below, while using an example in which the oxide semiconductor layer 27 is an In—Ga—Zn—O based semiconductor film.

In the description below, an atomic number ratio (composition ratio) of In with respect to all the elements mainly configuring the oxide semiconductor is abbreviated as an "In ratio". For example, the In ratio of the In—Ga—Zn—O based semiconductor layer is a ratio of the number of In atoms with respect to the total number of atoms of In, Ga, Zn, and O (oxygen). Similarly, atomic number ratios (composition ratios) of Ga, Zn, and O with respect to all the elements mainly configuring the oxide semiconductor are abbreviated as a "Ga ratio", a "Zn ratio", and an "0 ratio". When the number of In atoms is indicated as [In], the number of Ga atoms as [Ga], the number of Zn atoms as [Zn], and the number of O atoms as [O], the In ratio is expressed as [In]/([In]+[Ga]+[Zn]+[O]).

In the In—Ga—Zn—O based semiconductor film, when the Ga ratio is increased, the oxygen ratio in the film increases, and a more stable and highly reliable film can be formed. However, since a $Ga_2O_3$ component that has high insulating properties is increased, semiconductor properties deteriorate. In contrast, when the Ga ratio is lower, in other words, when the ratios of low-resistance In and Zn are higher, although high semiconductor properties can be realized, the reliability deteriorates. Thus, the Ga ratio in the first layer 31 is preferably smaller than the Ga ratio in the second layer 32. As a result, mobility of the first layer 31 can be made higher than that of the second layer 32, and at the same time, stability of the second layer 32 can be made higher than that of the first layer 31. In this case, the Ga ratio of the intermediate transition layer 33 continuously increases from the first layer 31 side toward the second layer 32 side. A difference of the Ga ratio between the first layer 31 and the second layer 32 is not particularly limited, but the difference is 5% or greater, for example, and preferably 10% or greater. When the difference of the Ga ratio is greater (15% or greater, for example), more noticeable effects are obtained as a result of the intermediate transition layer 33 being provided.

The In ratio in the first layer 31 may be higher than the In ratio in the second layer 32. A difference of the In ratio between the first layer 31 and the second layer 32 is not particularly limited, but the difference is 5% or greater, for example, and preferably 10% or greater. When the difference of the In ratio is greater (20% or greater, for example), more noticeable effects are obtained as a result of the intermediate transition layer 33 being provided. When the In ratio is higher in the first layer 31 than in the second layer 32 and the Ga ratio is higher in the second layer 32 than in the first layer 31, in the intermediate transition layer 33, for example, the Ga ratio may continuously increase from the first layer 31 side toward the second layer 32 side, and the In ratio may continuously decrease from the first layer 31 side toward the second layer 32 side.

A preferable composition of the first layer 31, which forms the channel layer, is as follows. The Ga ratio is 0% or more and less than 15%, for example (0<[Ga]/([In]+[Ga]+[Zn]+[O])<0.15). The total of the In ratio and the Zn ratio of the first layer 31 is greater than the Ga ratio ([In]+[Zn]>[Ga]). The In ratio may be less than 70% ([In]/([In]+[Ga]+[Zn]+[O])<0.7). Alternatively, the total of the In ratio and the Zn ratio may be less than 70% (([In]+[Zn])/([In]+[Ga]+[Zn]+[O])<0.7). Preferably, the In ratio is higher than the Ga ratio and the Zn ratio ([In]>[Ga], [In]>[Zn]).

The thickness of the first layer 31 is not particularly limited, and is greater than 0 nm and 20 nm or less, for example. The thickness of the first layer 31 is preferably 5 nm or greater and 10 nm or less. When the thickness of the first layer 31 is 10 nm or less, ON characteristics can be improved. When the thickness of the first layer 31 is 5 nm or greater, a high-mobility TFT can be realized since electrons preferentially move in the first layer 31 rather than in the intermediate transition layer 33.

A preferable composition of the second layer 32 is as follows. The Ga ratio is over 9% and less than 40%, for example (0.09<[Ga]/([In]+[Ga]+[Zn]+[O])<0.4). The IN ratio is preferably smaller than the Ga ratio ([In]<[Ga]). The total of the In ratio and the Zn ratio of the second layer 32 may be equal to or less than the Ga ratio ([In]+[Zn]≤[Ga]).

The thickness of the second layer 32 is not particularly limited, and is 20 nm or greater and 50 nm or less, for example. In a case where the thickness of the second layer 32 is 20 nm or greater, since the second layer 32 can function as the blocking layer (the protection layer and the barrier layer) more effectively, the reliability can be further improved. On the other hand, in a case where the thickness of the second layer 32 is 50 nm or less, since a resistance component generated in the oxide semiconductor layer 27 can be inhibited from increasing, a decrease in the mobility of the TFT 20 can be suppressed.

Note that in a case where the TFT 20 is the channel etched type TFT, the second layer 32 (the upper layer 27U) functions as the protection layer at the source/drain separation step. Thus, it is preferable that the Ga ratio of the second layer 32 be set to be even higher (20% or greater, for example), and/or the thickness of the second layer 32 be set to be even greater (30 nm or greater, for example).

It is sufficient that the intermediate transition layer 33 has a composition that changes so as to smoothly (continuously) bridge the difference in the composition ratios between the first layer 31 and the second layer 32. The thickness of the intermediate transition layer 33 is not particularly limited, but may be adjusted such that the total thickness of the oxide semiconductor layer 27 is 40 nm or greater and 70 nm or less, for example. The intermediate transition layer 33 may be thicker than the first layer 31 and the second layer 32. The thickness of the intermediate transition layer 33 may be 5 nm or greater and 50 nm or less, for example, and preferably 10 nm or greater and 30 nm or less. When the thickness of the intermediate transition layer 33 is less than 10 nm, there is a case in which it is difficult to smooth out the change in the composition depending on the difference in the composition ratios between the first layer 31 and the second layer 32. As long as the thickness of the intermediate transition layer 33 is 10 nm or greater and more preferably 20 nm or greater, the generation of the interface state due to the difference in the compositions can be suppressed more reliably. On the other hand, when the thickness of the intermediate transition layer 33 is 50 nm or less, an increase of the thickness of the oxide semiconductor layer 27 and the increase of the resistance component generated in the oxide semiconductor layer 27 can be suppressed.

Method for Forming Oxide Semiconductor Layer 27

Next, an example of a method for forming the oxide semiconductor layer 27 will be described below, while using a case in which the oxide semiconductor layer 27 is an In—Ga—Zn—O based semiconductor film.

The oxide semiconductor layer 27 is obtained by forming a layered film containing In, Sn, and Zn using the plasma MOCVD method, for example, and performing patterning on the layered film. Of the layered film, a film that forms the lower layer 27L of the oxide semiconductor layer 27 (the first layer 31, here) is referred to as a "lower film," a film that forms the intermediate transition layer 33 of the oxide semiconductor layer 27 as an "intermediate transition film," and a film that forms the upper layer 27U (the second layer 32, here) of the oxide semiconductor layer 27 as an "upper film." In the plasma MOCVD method, by adjusting the flow ratio of the organometallic compounds in the material gas, a layered film of a triple-layer structure having the above-described composition is formed. The lower film and the upper film can be formed by being deposited while setting the flow ratio of the material gas to predetermined values (the flow ratio is kept constant). The intermediate transition film can be formed by being deposited while continuously changing the flow ratio of the material gas. For example, by setting the flow ratio in stages and continuously supplying the material gas onto the substrate even while switching the flow ratio, the flow ratio of the material gas supplied onto the substrate can be continuously changed.

More specifically, first, a substrate on which the layered film is to be formed is placed in the chamber (between the lower electrode and the upper electrode). As described in the above-described embodiments, the carrier gas (argon, nitrogen, or the like) other than the MO gas or, depending on the situation, the oxygen is supplied into the chamber, and the pressure and the substrate temperature are adjusted. Further, at the same time at which the material gas containing the MO gas and the gas containing the oxygen are supplied into the chamber, the RF power for generating the plasma in the chamber is applied between the lower electrode and the upper electrode inside the chamber. The MO gas contains the first organometallic compound containing In, the second organometallic compound containing Zn, and the third organometallic compound containing Ga. The first organometallic compound may be TMIn, the second organometallic compound may be DEZ, and the third organometallic compound may be TMGa.

First, film formation is performed under a condition in which the flow ratio of the first organometallic compound, the second organometallic compound, and the third organometallic compound in the MO gas is set to be a predetermined value, and the lower film that forms the lower layer 27L of the oxide semiconductor layer 27 is obtained. With respect to the total MO gas supplied when forming the lower film, a ratio of the first organometallic compound is defined as F1a, a ratio of the second organometallic compound as F2a, and a ratio of the third organometallic compound as F3a. For example, when TMIn:DEZ:TMGa is set to be 6:6:1, F1a=6/13, F2a=6/13, and F3a=1/13 are established.

Next, a film formation is performed while continuously changing the ratio of the third organometallic compound from F3a to F3b, and the intermediate transition film that forms the intermediate transition layer 33 is formed on the lower film. Accordingly, the ratios of the first organometallic compound and the second organometallic compound may change as well. For example, while changing the ratio of the third organometallic compound, the ratio of the first organometallic compound may be continuously changed from F1a to F1b.

In a case where the lower film of the oxide semiconductor layer 27 forms the channel layer (the first layer 31), the film formation is performed while increasing the ratio of the third organometallic compound (in other words, F3a<F3b). At the same time, the ratio of the first organometallic compound may be decreased (in other words, F1a>F1b). When the lower film of the oxide semiconductor layer 27 forms the blocking layer (the second layer 32), the film formation is performed while decreasing the ratio of the third organometallic compound (in other words, F3a>F3b). At the same time, the ratio of the first organometallic compound may be increased (in other words, F1a<F1b).

Subsequently, film formation is performed under a condition in which the ratio of the first organometallic compound is set to be F1b, the ratio of the second organometallic compound to be F2b, and the ratio of the third organometallic compound to be F3b, and the upper film that forms the upper layer 27U of the oxide semiconductor layer 27 is formed on the intermediate transition film. In this manner, the layered film composed of three layers is formed. The layered film is an amorphous In—Ga—Zn—O based semiconductor film (part of which may be crystallized), for example. After this, patterning of the layered film is performed, and the oxide semiconductor layer 27 is obtained.

Figure 11A:
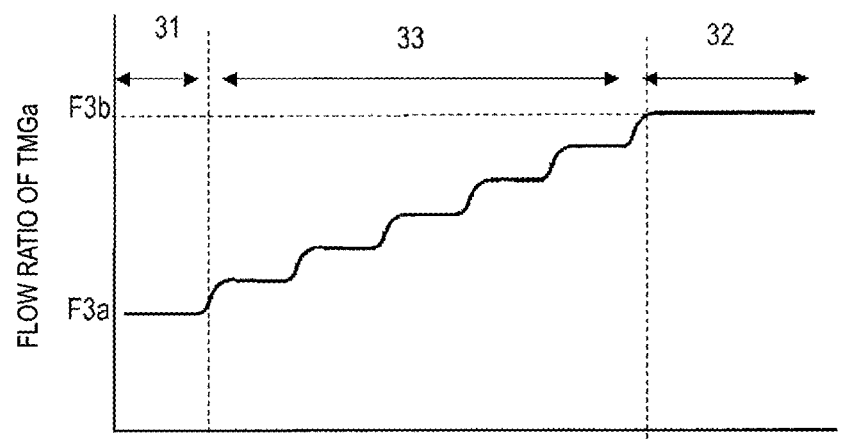
FIGS. 11A and 11B are diagrams respectively exemplifying changes in a proportion of a third organometallic compound contained in entire MO gas at a formation step of an oxide semiconductor film.
Figure 11B:
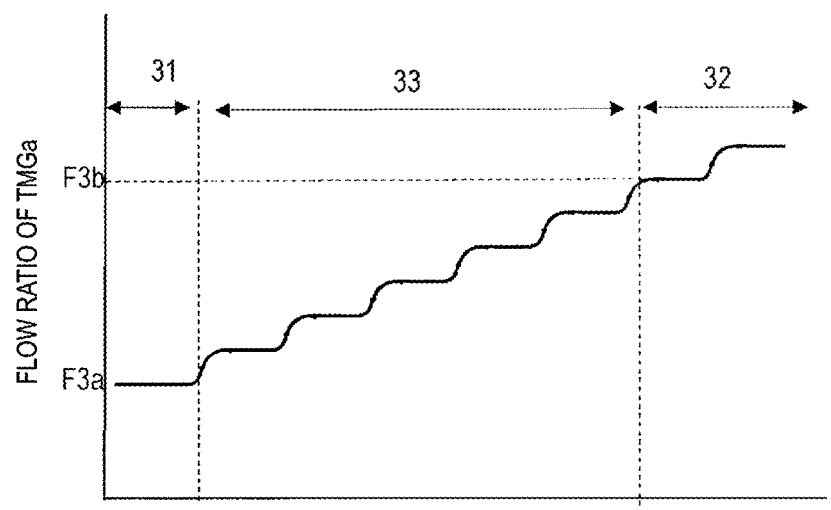

At the above-described film formation step, the ratio of the third organometallic compound contained in the total MO gas is illustrated in FIG. 11A. Note that only the film that forms the channel layer (the first layer 31) may be formed while keeping the flow ratio of the MO gas constant, and then, the films that form the intermediate transition layer 33 and the second layer 32 may be formed while changing the flow ratio of the MO gas. The ratio of the third organometallic compound at the film formation step of this case is illustrated in FIG. 11B. By forming at least the film that forms the channel layer while keeping the flow ratio of the MO gas constant, a high-mobility TFT can be realized.

As illustrated in FIG. 11B, when the second layer 32 is formed while changing the flow ratio of the MO gas, the composition of the second layer 32 continuously changes. The composition of the second layer 32 may continuously change in the same direction as the composition of the intermediate transition layer 33. For example, the Ga ratio of the second layer 32 may continuously increase from the intermediate transition layer 33 side toward the surface of the second layer 32. In this case, each of the second layer 32 and the intermediate transition layer 33 becomes a layer that has a continuously changing composition (a composition transition layer). Of the composition transition layer, a portion which is positioned on the first layer 31 side and has a Ga ratio of 15% or less can be regarded as the intermediate transition layer 33, and a portion that has a Ga ratio of over 15% can be regarded as the second layer 32 that functions as the blocking layer.

Note that the flow ratios illustrated in FIG. 11A and FIG. 11B are merely examples. The flow ratio of the MO gas used when forming the intermediate transition layer may be changed in one stage, but may be preferably changed in two or more stages, and more preferably in three or more stages. In those cases, an amount of the change and a deposition time may be different for each of the stages.

The method for forming the oxide semiconductor layer 27 is not limited to the above-described method. For example, the oxide semiconductor layer 27 can be formed by the MOCVD method of the related art that does not use plasma. However, as described in the above-described embodiments, with the MOCVD method, the organic group, such as the methyl group, is likely to remain in the oxide semiconductor film, and there may be a case in which desired TFT properties are not obtained. According to the plasma MOCVD method, since the oxide semiconductor film, in which the amount of residual methyl group is reduced, can be formed, the plasma MOCVD method is more preferable.

Here, with reference to FIG. 10 once again, an example of a method for manufacturing the TFT 20, which includes the oxide semiconductor layer 27 as the active layer, will be described.

First, on the support substrate 21, the gate electrode 23, and then the gate insulating layer 25 are formed in this order.

A glass substrate, a silicon substrate, a plastic substrate (resin substrate) having heat resistance, or the like can be used as the support substrate 21, for example.

The gate electrode 23 is formed by forming a gate conductive film (having a thickness of 50 nm or more and 500 nm or less) on the substrate 21 (the glass substrate, for example) by the sputtering method or the like, and performing patterning on the gate conductive film. The material of the gate conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used.

The gate insulating layer 25 can be formed by the CVD method or the like, for example. As the gate insulating layer 25, a silicon oxide ($SiO_2$) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 25 may have a layered structure. For example, a silicon nitride layer, a silicon nitride oxide layer, or the like may be formed as a substrate-side layer (lower layer) in order to prevent diffusion of impurities and the like from the support substrate 21, and a silicon oxide layer, a silicon oxynitride layer, or the like may be formed as a layer (upper layer) on top of the substrate-side layer in order to ensure insulating properties. Here, a layered film is used that includes an $SiO_2$ film having a thickness of 50 nm as the upper layer and an SiNx film having a thickness of 300 nm as the lower layer. In this way, when an insulating layer that contains oxygen (an oxide layer such as an $SiO_2$ layer, for example) is used as the uppermost layer of the gate insulating layer 25 (in other words, the layer that is in contact with the oxide semiconductor layer), in a case in which the oxygen deficiency occurs in the oxide semiconductor layer 27, since the oxygen deficiency can be recovered by the oxygen contained in the oxide layer, the oxygen deficiency of the oxide semiconductor layer 27 can be mitigated.

Next, the oxide semiconductor layer 27 having a layered structure is formed on the gate insulating layer 25. The oxide semiconductor layer 27 is formed by the above-described method, using the plasma MOCVD method, for example. After forming the oxide semiconductor layer 27, heat treatment may be performed in an ambient atmosphere at a temperature of 350° C. or higher (450° C., for example).

Next, an insulating film is formed on the oxide semiconductor layer 27, and by performing patterning on the insulating film, the etch stop layer 37 is obtained. The etch stop layer 37 is an $SiO_2$ layer (having a thickness of 150 nm, for example), for example. The etch stop layer 37 covers a portion of the oxide semiconductor layer 27 that forms the channel region, and has openings in portions that form the source contact and drain contact regions.

Next, the source electrode 28 and the drain electrode 29 are formed. First, using the sputtering method, for example, a source conductive film is formed both on the etch stop layer 37 and in the openings of the etch stop layer 37. By performing patterning on the source conductive film, the source electrode 28 and the drain electrode 29 are obtained. The source electrode 28 and the drain electrode 29 are in contact with the oxide semiconductor layer 27 (the source contact region and the drain contact region) in the openings. The source conductive film may have a single-layer structure or a layered structure. Here, as the source conductive film, a layered film is formed in which a Ti film (having a thickness of 30 nm), an Al or Cu film (having a thickness of 300 nm), and a Ti film (having a thickness of 50 nm) are stacked, in this order from the oxide semiconductor layer 27 side.

Note that in a case where the channel etched type TFT is used, the etch stop layer 37 is not formed, and the source conductive film is formed so as to cover the oxide semiconductor layer 27. Next, patterning is performed on the source conductive film, and the source electrode 28 and the drain electrode 29 are obtained (the source/drain separation). At this time, a surface of the portion of the oxide semiconductor layer 27 that forms the channel region is sometimes etched (over-etching). For example, there may be a case in which part or all of the upper layer of the portion of the oxide semiconductor layer 27 that forms the channel region is removed.

Next, oxidation treatment is performed on the channel region of the oxide semiconductor layer 27. Here, plasma treatment using $N_2O$ gas is performed. Treatment conditions are not particularly limited. A pressure of the $N_2O$ gas is set to 100 Pa or higher and 300 Pa or lower, for example, a plasma power density to 0.2 W/cm$^2$ or greater and 1.5 W/cm$^2$ or less, the treatment time to 5 to 100 sec, and the substrate temperature to 200° C. or higher and 450° C. or lower, for example, preferably 200° C. or higher and 350° C. or lower, and more preferably set to 200° C. or higher and 300° C. or lower.

Next, the insulating layer 35 is formed on the TFT 20. The insulating layer 35 may be an inorganic insulating layer such as a silicon oxide ($SiO_2$) film, a silicon nitride (SiNx) film, a silicon oxynitride (SiOxNy; x>y) film, or a silicon nitride oxide (SiNxOy; x>y) film, for example. Here, as the insulating layer 35, an $SiO_2$ layer having a thickness of 300 nm, for example, is formed using the CVD method. After this, heat treatment may be performed at a temperature of 200° C. or higher and lower than 350° C., for example. In this way, the oxygen deficiency that has occurred in the oxide semiconductor layer 27 when forming the insulating layer 35 can be mitigated.

Although not illustrated, a flattened layer, such as an organic insulating layer, may be provided on the insulating layer 35. In this way, the TFT 20 is manufactured.

TFT Structure

The structure of the TFT to which a channel structure of the present embodiment can be applied is not particularly limited. Although the TFT 20 illustrated in FIGS. 9A and 9B has a top contact structure in which the source and drain electrodes are in contact with the upper face of the semiconductor layer, the TFT 20 may have a bottom contact structure in which the source and drain electrodes are in contact with a lower face of the semiconductor layer.

Further, the TFT of the present embodiment may have a channel etched structure or an etch stop structure. As illustrated in FIGS. 9A and 9B, the channel etched type TFT does not include an etch stop layer formed on the channel region, and a lower face of an end portion of each of the source and drain electrodes, which is closer to the channel, is provided so as to be in contact with the upper face of the semiconductor layer. The channel etched type TFT is formed by forming a conductive film for the source and drain electrodes on the oxide semiconductor layer, and separating the conductive film into the source and drain, for example. In separating the source and drain, a surface portion of the channel region may be etched.

As illustrated in FIG. 10, in the etch stop type TFT, an etch stop layer is formed on the channel region. The lower face of the end portion of each of the source and drain electrodes, which is closer to the channel, is positioned on the etch stop layer, for example. The etch stop type TFT is formed by forming an etch stop layer that covers the portion of the oxide semiconductor layer that forms the channel region, then forming a conductive film for the source and drain electrodes on both the oxide semiconductor layer and the etch stop layer, and separating the conductive film into the source and drain, for example. In the etch stop type TFT, by covering a side surface of the semiconductor layer using the etch stop layer, an occurrence of the above-described residual film can be suppressed. However, when the side surface of the semiconductor layer has a narrowed portion, the covering performance of the etch stop layer on the side surface of the semiconductor layer deteriorates, and a highly reliable TFT may not be obtained.

Although the above-described TFT 20 has the bottom gate structure in which the gate electrode 23 is disposed between the oxide semiconductor layer 27 and the support substrate 21, the TFT 20 may have the top gate structure in which the gate electrode 23 is disposed on the opposite side to the support substrate 21 of the oxide semiconductor layer 27.

The oxide semiconductor layer 27 of the present embodiment can be preferably applied to the channel etched type TFT having the top contact structure. In a case where the oxide semiconductor layer 27 of the present embodiment is applied to this type of TFT, since process damage to a first oxide semiconductor layer can be suppressed at the source/drain separation step or the like, more noticeable effects are obtained.

The present embodiment can be applied to an active matrix substrate of a display device, for example. When the present embodiment is applied to the active matrix substrate, it is sufficient that at least some of a plurality of TFTs provided in the active matrix substrate are the above-described oxide semiconductor TFTs having the layered structure. For example, a TFT (circuit TFT) that configures a pixel TFT arranged for each pixel, and/or a TFT that configures a monolithic driver may be the TFT 20. Since the structure of the active matrix substrate is known, a description thereof is omitted herein.

EXAMPLES AND COMPARATIVE EXAMPLES

A TFT of Example I that is provided with an oxide semiconductor layer having a triple-layer structure was prepared, and properties of the TFT were evaluated. The evaluation method and results will be described below.

Method for Forming Oxide Semiconductor Layers of TFTs of Example I and Comparative Example I In Example I, an etch stop type TFT having the bottom gate structure is formed on a glass substrate (see FIG. 10).

The oxide semiconductor layer was formed using the plasma MOCVD method. Here, an In—Ga—Zn—O based semiconductor film was grown while changing the flow ratio of the organometallic compounds in the MO gas in stages, namely, while changing a set value of TMIn:TMGa:DEZ from 6:1:6 to 1:3:1 in stages. The set value of the flow ratio was changed in five stages from a Depo-01 step to a Depo-05 step (the flow ratio was kept constant within each of the steps). The MO gas was continuously supplied into the chamber even while switching the setting of the flow ratio between the steps (for example, during a period when the setting of the flow ratio was changed from 6:1:6 to 4:1:4 between the Depo-01 step and the Depo-02 step). Thus, the actual flow ratio of the MO gas supplied into the chamber continuously changes.

A lower film (having a thickness of approximately 16 nm) that forms the first layer 31 was formed at the Depo-01 step, an intermediate transition film (having a thickness of approximately 16 nm) that forms the intermediate transition layer 33 was formed at the Depo-02 to Depo-04 steps, and an upper film (having a thickness of approximately 16 nm) that forms the second layer 32 was formed at the Depo-05 step. The film formation time, the flow rate of the oxygen gas, the flow ratio of TMIn:TMGa:DEZ in the MO gas, the pressure inside the chamber, the RF power, the interelectrode distance, and the substrate temperature at each of the Depo-01 to Depo-05 steps are shown in Table 4.

TABLE 4

| | Depo-01 | Depo-02 | Depo-03 | Depo-04 | Depo-05 |
|---|---|---|---|---|---|
| Film Formation Time (sec) | 400 | 100 | 100 | 100 | 200 |
| Flow Rate of Oxygen Gas (sccm) | 12000 | 12000 | 12000 | 12000 | 12000 |
| MO Gas Flow Ratio (Set Value) TMIn:TMGa:TMZn | 6:1:6 | 4:1:4 | 3:1:3 | 1:2:1 | 1:3:1 |
| Ratio of TMGa in Total Flow Rate of MO Gas (Set Value) | 0.08 | 0.11 | 0.14 | 0.5 | 0.6 |
| Ratio of TMIn in Total Flow Rate of MO Gas (Set Value) | 0.46 | 0.45 | 0.43 | 0.25 | 0.2 |
| Pressure (Torr) | 2.5 | 2.5 | 2.5 | 2.5 | 2.5 |
| RF Power (W) | 1000 | 1000 | 1000 | 1000 | 1000 |
| Interelectrode Distance (mil) | 600 | 600 | 600 | 600 | 600 |
| Temperature (° C.) | 350 | 350 | 350 | 350 | 350 |

For the purpose of comparison, an oxide semiconductor layer was formed using the sputtering method, and the TFT of Comparative Example I was manufactured. In the sputtering method, a target of In:Ga:Zn=1:2:1 was used, and the oxide semiconductor layer having the constant composition ratio was formed.

Composition Analysis of Oxide Semiconductor Layer

The element distributions in the depth direction of the oxide semiconductor layers of Example I and Comparative Example I were examined by Auger electron spectroscopy.

Figure 12:
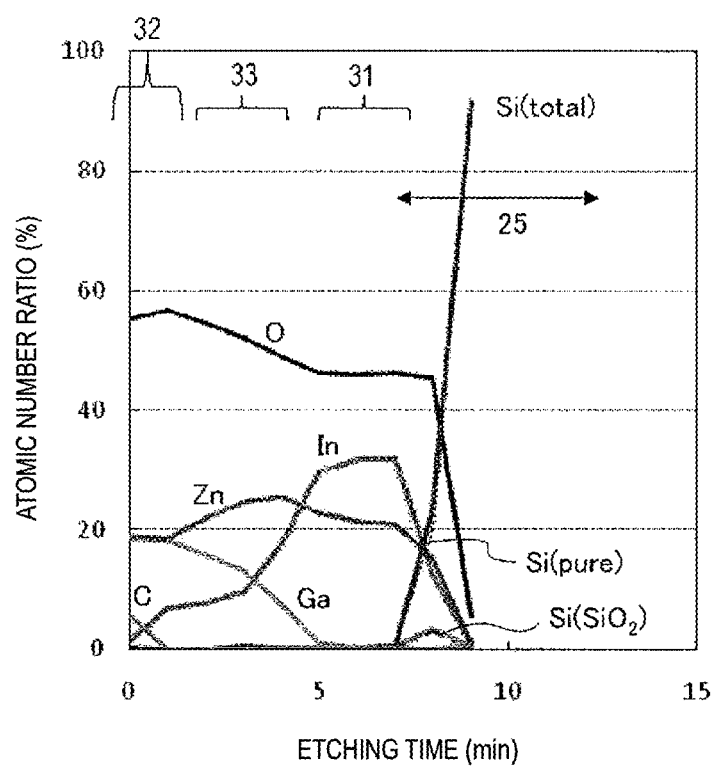
FIG. 12 is a diagram illustrating composition analysis results, in a depth direction, of an oxide semiconductor layer of a TFT of Example I.

FIG. 12 is a diagram illustrating the composition analysis results of the oxide semiconductor layer of Example I. The horizontal axis is an etching time that corresponds to the depth from the surface of the sample. The vertical axis is the atomic ratio. In FIG. 12, Si that has a metallic bonded state is indicated as "Si(pure)", Si that has an oxide bonded state (a metal that constitutes $SiO_2$) as "Si($SiO_2$)", and Si that includes all the bonded states as "Si(total)". Note that although the carbon (C) component is shown near the surfaces of the oxide semiconductor layers of Example I and Comparative Example I in the analysis results illustrated in FIG. 12 and FIG. 13 due to a measurement problem, those oxide semiconductor layers do not substantially contain the carbon component in reality (this is clear from that, although the oxide semiconductor layer formed by the sputtering method (Comparative Example I) does not essentially contain any carbon, the carbon component is erroneously detected in this analysis).

As understood from FIG. 12, in Example I, the first layer 31 and the second layer 32 of the oxide semiconductor layer include regions that has a substantially constant composition, and in the intermediate transition layer 33, the composition is continuously changing. Further, the first layer 31 includes more of the In and Zn components than the Ga component, and the second layer 32 includes more of the Ga and Zn components than the In component.

Figure 13:
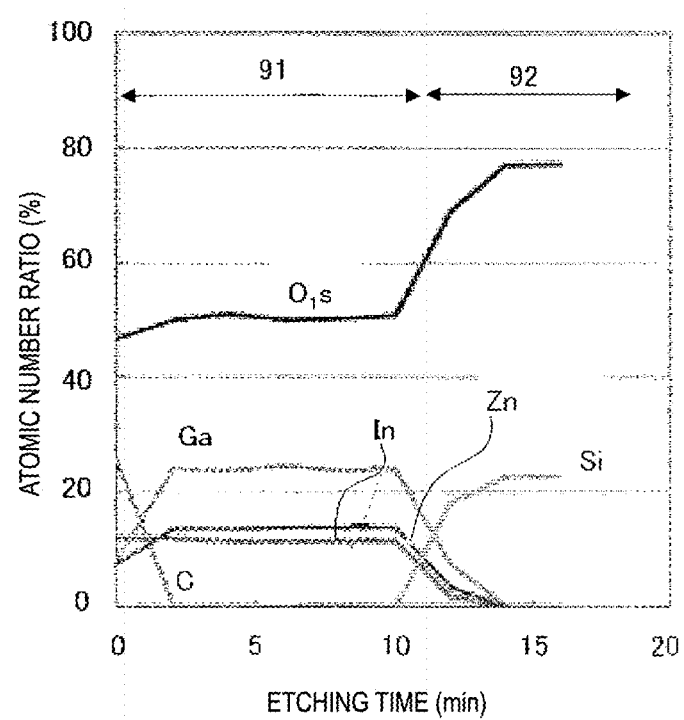
FIG. 13 is a diagram illustrating composition analysis results, in the depth direction, of an oxide semiconductor layer of a TFT of Comparative Example I.

FIG. 13 is a diagram illustrating analysis results of an oxide semiconductor layer 91 and part of a gate insulating film 92 of the TFT of Comparative Example I. As illustrated in FIG. 13, in Comparative Example I, the composition ratios of the oxide semiconductor layer are constant in the thickness direction.

Evaluation of TFT Properties

Figure 14:
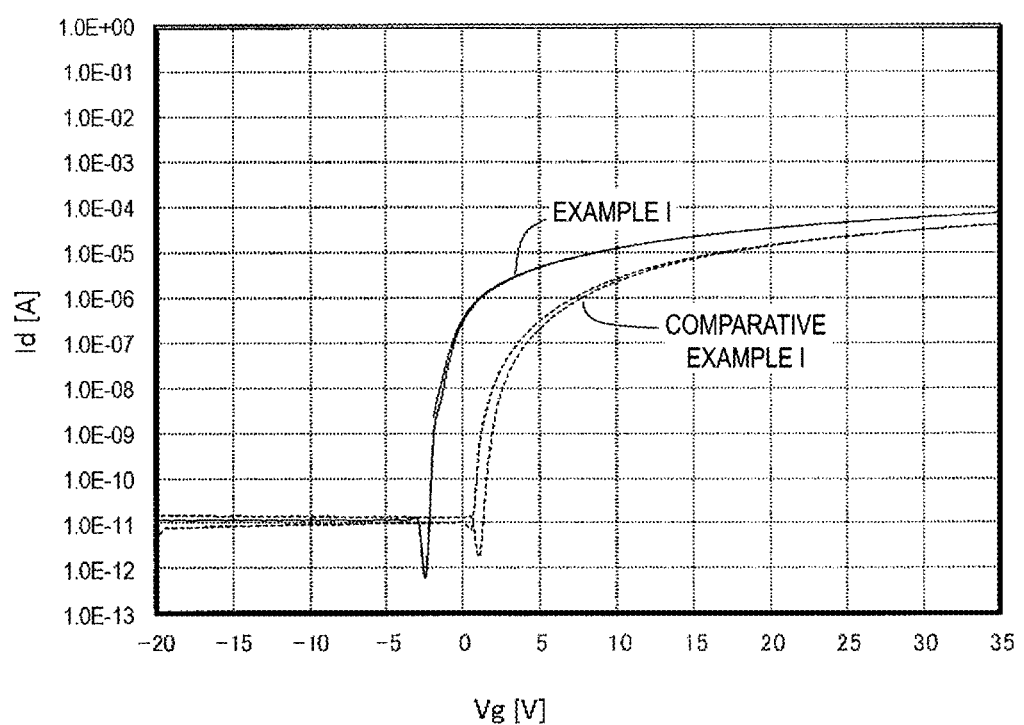
FIG. 14 is a diagram illustrating current-voltage characteristics of the TFTs of Example I and Comparative Example I.

Next, current-voltage characteristics (Id-Vg characteristics) of the TFTs of Example I and Comparative Example I were examined. The results are shown in FIG. 14. Further, a threshold voltage Vth and mobility μ of each of the TFTs are shown in Table 5.

TABLE 5

|  | Threshold Voltage Vth (V) | Mobility μ ($cm^2/Vs$) |
| --- | --- | --- |
| Example I | −1.6 | 32.8 |
| Comparative Example I | 4.25 | 3.55 |

From these results, it has been confirmed that desired TFT properties can be realized by forming the oxide semiconductor layer using the plasma MOCVD method. It is understood that the TFT of Example I has higher mobility than the TFT of Comparative Example I. It is considered that this is because the TFT of Example I includes a layer (channel layer) having a higher In ratio than that of the oxide semiconductor layer of Comparative Example I.

Third Embodiment

In a third embodiment, a film formation apparatus that can be applied to the formation of the oxide semiconductor film will be described. The film formation apparatus of the present embodiment is a plasma-assisted MOCVD apparatus. The film formation apparatus of the present embodiment can be used to form the oxide semiconductor film described in the first and second embodiments.

The film formation apparatus of the present embodiment can be used to manufacture various semiconductor devices, including the oxide semiconductor film. In particular, the film formation apparatus of the present embodiment is preferably applied when forming the oxide semiconductor film on a support substrate that has a relatively low melting point (500° C. or lower), such as a glass substrate. The semiconductor device may be an active matrix substrate provided with an oxide semiconductor TFT, for example.

Figure 15:
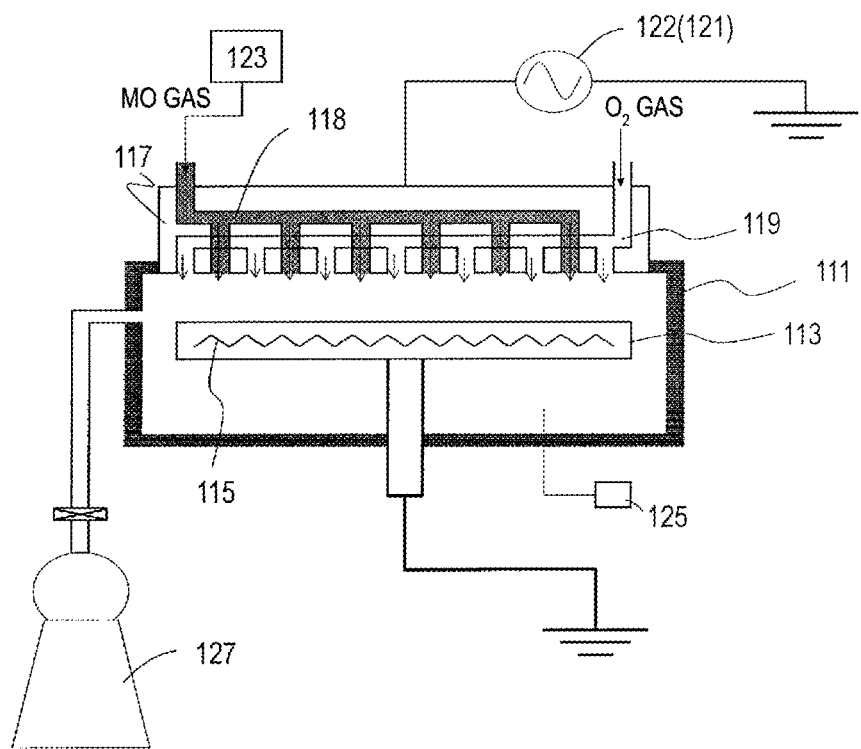
FIG. 15 is a plan view schematically illustrating a configuration of a film formation apparatus (a plasma-assisted MOCVD apparatus) of a third embodiment.

FIG. 15 is a cross-sectional view schematically illustrating a configuration of the film formation apparatus (the plasma-assisted MOCVD apparatus) of the present embodiment.

A film formation apparatus 100 is provided with a chamber 111, a support body 113 that is conductive and supports a substrate to be processed (hereinafter simply referred to as a "substrate") in the chamber 111, a gas distribution shower head 117 that is conductive and disposed above the substrate in the chamber 111, a power supply unit 121 that supplies power between the support body 113 and the gas distribution shower head 117, a first gas supply unit that supplies the MO gas into the chamber 111, and a second gas supply unit that supplies the oxygen into the chamber 111. The gas distribution shower head 117 and the support body 113 are also used as an upper electrode and a lower electrode for generating plasma, respectively.

In the chamber 111, a heating device 115 for heating the substrate is further provided. As the heating device 115, a heater may be disposed in the interior of the support body 113. In the gas distribution shower head 117, a plurality of first gas passages 118 and a plurality of second gas passages 119 are formed at intervals. In the interior of the gas distribution shower head 117, the gas passages 118 and 119 extend from the outside of the chamber 111 to the interior of the chamber 111. The first gas supply unit supplies the material gas containing the MO gas and the carrier gas into the chamber 111 via the first gas passages 118. The second gas supply unit supplies gas containing the oxygen into the chamber 111 via the second gas passages 119.

The power supply unit 121 includes a high frequency power source 122 that is connected to at least one of the support body 113 and the gas distribution shower head 117. In this example, the high frequency power source 122 is connected to the gas distribution shower head 117, and the support body 113 is grounded. By supplying the power between the support body 113 and the gas distribution shower head 117, plasma can be formed inside the chamber 111.

The gas passages 118 and 119 of the gas distribution shower head 117 are connected to a gas generation unit 123. The gas generation unit 123 generates the MO gas containing organometallic compounds. As the gas generation unit 123, various known MO gas generation devices can be used. The material gas containing the carrier gas and the MO gas may be generated by bubbling the carrier gas in tanks storing liquid organometallic compounds, for example. The gas generation unit 123 may be provided with a flow rate control unit that controls a flow ratio of each of the organometallic compounds.

Although not illustrated, the film formation apparatus 100 is provided with a controller. The controller controls operations of the power supply unit 121 and the first and second gas supply units such that gas containing the MO gas and the oxygen is supplied into the chamber 111 at the time of the film formation, under a condition in which the plasma is generated as a result of the power being supplied between the support body 113 and the gas distribution shower head 117. As a result, since the organometallic compounds and the oxygen are caused to a plasma state and become chemically active, the organometallic compounds react with the oxygen inside the chamber 111 or on the surface of the substrate and are deposited on the surface of the substrate.

The film formation apparatus 100 is preferably further provided with a pressure controller that controls a pressure inside the chamber 111, and a temperature controller that controls a substrate temperature on the support body 113. The pressure controller includes a pressure gage 125 that measures the pressure inside the chamber 111, and a vacuum pump 127 that is connected to the interior of the chamber 111.

In an MOCVD apparatus of the related art, it is assumed that the film formation is performed at a high temperature. For example, in JP 2013-503490 T, an MOCVD apparatus for forming a Group III nitride film on a Si wafer is disclosed. The substrate temperature is approximately 1000° C., for example.

In contrast, in the film formation apparatus 100 of the present embodiment, a decomposition degree of the MO gas can be increased utilizing the plasma. Thus, even though the substrate temperature is set to be a relatively low temperature (500° C. or lower, and preferably 400° C. or lower), a good quality oxide semiconductor film can be formed in which a concentration of impurities (particularly carbon originating from the methyl group) is reduced. Thus, a glass substrate or the like having a low melting point can be used as the support substrate.

Further, in the film formation apparatus 100, the MO gas is supplied from above the chamber 111 in the normal direction of the substrate, via the plurality of first gas passages 118. Thus, in comparison with a case in which the MO gas is supplied from a side surface of the chamber in the horizontal direction to the substrate, the MO gas can be supplied to the surface of the substrate in a more homogeneous manner. Thus, when forming a plurality of the oxide semiconductor TFTs on the substrate, variations in the TFT properties can be reduced.

Further, it is considered that unlike a film formation process of a plasma CVD, which is a normal process, with the plasma generated by the MO gas, a metal component to which metal seed themselves and the methyl group are attached become film formation seed that contributes to the film deposition. Thus, in comparison with a case in which radicals are the film formation seeds (in an a-Si film formation process of the plasma CVD, long-life $SiH_3$ radicals having a long diffusion distance and the like are the main film formation seeds, for example), for example, there is a possibility that a diffusion distance of the film formation seed is shorter. Thus, when a remote plasma MOVD apparatus is used, for example, since a plasma area in which the MO gas is decomposed is separated from a film formation area, there is a problem that it is difficult for the metal component to effectively contribute to the film formation. In contrast, in the film formation apparatus 100, as illustrated in FIG. 1A, since the substrate 1, which is the substrate to be processed, is positioned in or immediately below the plasma area, the film formation seeds in a plasma state generated by the MO gas easily contribute to the film formation.

Figure 16:
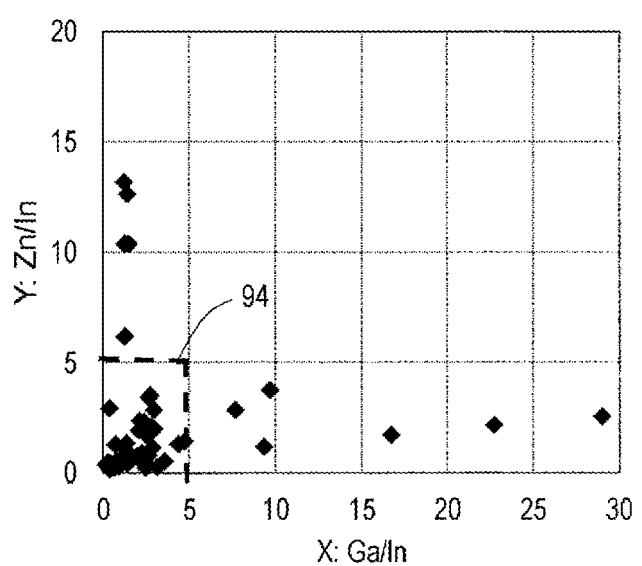
FIG. 16 is a diagram for describing a composition range of the In—Ga—Zn—O based semiconductor film.

Further, in a case where the film formation apparatus 100 is used, in comparison with the sputtering method, the composition of the oxide semiconductor film can be selected with a higher degree of freedom. By adjusting the flow ratio of the material gas, the layered structure of the oxide semiconductor films having different compositions can be easily formed. For example, upon forming the In—Ga—Zn—O based semiconductor film, in a case where the composition ratios of In:Ga:Zn are 1:X:Y, a composition range 94 of a typical sputter target is $0<X<5$ and $0<Y<5$ (see FIG. 16). In contrast, according to the present embodiment, a composition range, which is considered as a transition state that is beyond a physically stable region, can also be realized. For example, by increasing the flow ratio of DEZ in the material gas, the In—Ga—Zn—O based semiconductor film having a composition of $5<Y$, or by increasing the flow ratio of TMGa, the In—Ga—Zn—O based semiconductor film having a composition of $5 \leq X$ can be easily formed.

Each constituent element of the film formation apparatus 100 may have the same configuration as in the MOCVD apparatus disclosed in JP 2013-503490 T, for example. For reference, the entire contents of JP 2013-503490 T are incorporated herein. However, although a mechanism that rotates a support body is provided in JP 2013-503490 T, since the film formation apparatus 100 is not intended to be used to form a film on a heat resistant substrate, such as a Si wafer, such a mechanism is not required in the film formation apparatus 100. Note that although a device for forming plasma in a chamber is described in the MOCVD apparatus of JP 2013-503490 T, the device is used to cause chlorine gas for cleaning to a plasma state, for the purpose of cleaning the gas distribution shower head and the like, or etching the residues. The device is not intended to be used to cause the material gas to the plasma state during film formation as in the film formation apparatus 100.

INDUSTRIAL APPLICABILITY

The embodiments of the disclosure can be widely applied to various semiconductor devices provided with an oxide semiconductor TFT. The embodiments are also applied to various electronic devices, including circuit substrates such as an active matrix substrate, display devices such as a liquid crystal display device, an organic electroluminescence (EL) display device, an inorganic electroluminescence display device, and an MEMS display device, image taking devices such as an image sensor device, image input devices, fingerprint readers, semiconductor memories, and the like, for example.

REFERENCE SIGNS LIST

1 Substrate
2A, 2B In—Ga—Zn—O based semiconductor film
21 Substrate
23 Gate electrode
25 Gate insulating layer
27 Oxide semiconductor layer
27L Lower layer
27U Upper layer
27c Channel region
27d Drain contact region
27s Source contact region
28 Source electrode
29 Drain electrode
31 First layer
32 Second layer
33 Intermediate transition layer
35 Insulating layer
37 Etch stop layer
100 Film formation apparatus
111 Chamber
113 Support body
115 Heating device
117 Gas distribution shower head
118 First gas passage
119 Second gas passage
121 Power supply unit
122 High frequency power source 123 Gas generation unit
125 Pressure gage
127 Vacuum pump

The invention claimed is:

1. A method for manufacturing a semiconductor device provided with a substrate and an oxide semiconductor thin-film transistor (TFT) that is supported by the substrate and includes an oxide semiconductor film as an active layer, the method for manufacturing comprising:
  (A) preparing MO gas containing a first organometallic compound that contains In and a second organometallic compound that contains Zn; and
  (B) supplying gas containing the MO gas and oxygen to the substrate in a chamber under a condition in which the substrate is heated to 500° C. or lower, generating a plasma in the chamber, and growing the oxide semiconductor film containing In and Zn on the substrate using an MOCVD method by using thermal energy and plasma energy to decompose the MO gas.

2. The method for manufacturing a semiconductor device according to claim 1, wherein in step (B), a pressure of the chamber is set to be $3.3 \times 10^2$ Pa or higher and lower than $2.7 \times 10^3$ Pa.

3. The method for manufacturing a semiconductor device according to claim 1, wherein in step (B), the plasma is generated by a high frequency electric field, and a power density applied when generating the plasma is 1440 W/m$^2$ or greater and 4800 W/m$^2$ or less.

4. The method for manufacturing a semiconductor device according to claim 1, wherein at least one of the first organometallic compound and the second organometallic compound contains a methyl group.

5. The method for manufacturing a semiconductor device according to claim 4, wherein
  the substrate includes a glass substrate, and
  in a case where compositions in a depth direction of the oxide semiconductor film and the substrate are analyzed by a secondary ion mass spectrometry, a carbon component content contained in the oxide semiconductor film is 1/10 or less of the carbon component content contained in the glass substrate.

6. The method for manufacturing a semiconductor device according to claim 4, wherein the oxide semiconductor film does not substantially contain any carbon component.

7. The method for manufacturing a semiconductor device according to claim 1, wherein
  the oxide semiconductor film is an In—Ga—Zn—O based semiconductor film and includes a layered structure including a lower film, an intermediate transition film, and an upper film from a side of the substrate in this order,
  the MO gas further contains a third organometallic compound that contains Ga, and
  step (B) includes:
  (B1) forming the lower film on the substrate under a condition in which, of a flow rate of the MO gas supplied to the substrate, a proportion F1 of the first organometallic compound is set to F1a, a proportion F2 of the second organometallic compound is set to F1a, and a proportion F3 of the third organometallic compound is set to F3a and in which F1:F2:F3 is kept constant;
  (B2) forming the intermediate transition film on the lower film while continuously changing F1:F2:F3 by continuously changing the proportion of the third organometallic compound from F3a to F3b and the proportion of the first organometallic compound from F1a to F1b with respect to the flow rate of the MO gas supplied to the substrate; and
  (B3) forming the upper film on the intermediate transition film under a condition in which, of the flow rate of the MO gas supplied to the substrate, the proportion F1 of the first organometallic compound is set to F1b, the proportion F2 of the second organometallic compound is set to F2b, and the proportion F3 of the third organometallic compound is set to F3b and in which F1:F2:F3 is kept constant, and
  the proportions of the first organometallic compound and the third organometallic compound satisfy either F3a<F3b and F1a>F1b, or F3a>F3b and F1a<F1b.

8. The method for manufacturing a semiconductor device according to claim 7, wherein the intermediate transition film is thicker than the lower film and the upper film.

9. The method for manufacturing a semiconductor device according to claim 7, wherein
  when F3a<F3b and F1a>F1b is satisfied, a thickness of the lower film is 5 nm or greater and 10 nm or less, a thickness of the upper film is 20 nm or greater and 50 nm or less and a thickness of the intermediate transition film is 5 nm or greater and 50 nm or less, and
  when F3a>F3b and F1a<F1b is satisfied, a thickness of the lower film is 20 nm or greater and 50 nm or less, a thickness of the upper film is 5 nm or greater and 10 nm or less and a thickness of the intermediate transition film is 5 nm or greater and 50 nm or less.

10. The method for manufacturing a semiconductor device according to claim 7, wherein in the step (B2), F1:F2:F3 is continuously changed by switching a value of F1:F2:F3 in stages and continuously supplying the MO gas to the substrate even while switching the value.

* * * * *